(12) United States Patent
Allen et al.

(10) Patent No.: US 8,508,015 B2
(45) Date of Patent: Aug. 13, 2013

(54) SCHOTTKY-LIKE CONTACT AND METHOD OF FABRICATION

(75) Inventors: Martin Ward Allen, Christchurch (NZ); Steven Michael Durbin, Christchurch (NZ)

(73) Assignee: Canterprise Limited, Christchurch (NZ)

( * ) Notice: Subject to any disclaimer, the term of this patent is extended or adjusted under 35 U.S.C. 154(b) by 544 days.

(21) Appl. No.: 12/451,530

(22) PCT Filed: May 19, 2008

(86) PCT No.: PCT/NZ2008/000109
§ 371 (c)(1),
(2), (4) Date: Nov. 17, 2009

(87) PCT Pub. No.: WO2008/143526
PCT Pub. Date: Nov. 27, 2008

(65) Prior Publication Data
US 2010/0127255 A1    May 27, 2010

Related U.S. Application Data

(60) Provisional application No. 60/924,502, filed on May 17, 2007.

(51) Int. Cl.
*H01L 29/47* (2006.01)
(52) U.S. Cl.
USPC ....... 257/471; 257/43; 257/E29.338; 438/570
(58) Field of Classification Search
USPC ............ 257/43, E29.094, E29.317, 471–486, 257/E29.338, E21.458; 438/104, 570–583
See application file for complete search history.

(56) References Cited

U.S. PATENT DOCUMENTS

| | | | | |
|---|---|---|---|---|
| 5,016,074 A * | 5/1991 | Sands | | 257/744 |
| 5,614,727 A * | 3/1997 | Mauri et al. | | 257/43 |
| 6,117,703 A * | 9/2000 | Penndorf | | 438/63 |
| 6,287,476 B1 * | 9/2001 | Ju et al. | | 216/47 |
| 2003/0129813 A1 * | 7/2003 | Lu et al. | | 438/571 |
| 2007/0114528 A1 | 5/2007 | Herman | | |
| 2007/0205456 A1 * | 9/2007 | Lee et al. | | 257/314 |

FOREIGN PATENT DOCUMENTS

JP    2004-214434    7/2004

OTHER PUBLICATIONS

International Search Report dated Aug. 14, 2008.
M.W. Allen et al., "*Influence of spontaneous polarization on the electrical and optical properties of bulk, single crystal ZnO,*" Applied Physics Letters, vol. 90, Article 062104, pp. 1-3 (Feb. 5, 2007).

(Continued)

*Primary Examiner* — Tucker Wright
(74) *Attorney, Agent, or Firm* — Jacobson Holman PLLC

(57) ABSTRACT

The present invention provides Schottky-like and ohmic contacts comprising metal oxides on zinc oxide substrates and a method of forming such contacts. The metal oxide Schottky-like and ohmic contacts may be formed on zinc oxide substrates using various deposition and lift-off photolithographic techniques. The barrier heights of the metal oxide Schottky-like contacts are significantly higher than those for plain metals and their ideality factors are very close to the image force controlled limit. The contacts may have application in diodes, power electronics, FET transistors and related structures, and in various optoelectronic devices, such as UV photodetectors.

40 Claims, 10 Drawing Sheets

(56) References Cited

OTHER PUBLICATIONS

M.W. Allen et al., "*Metal Schottky diodes on Zn-polar and O-polar bulk ZnO,*" Applied Physics Letters, vol. 89, Article 103520, pp. 1-3 (Sep. 7, 2006).

Soon-Hyung Kang et al., "*Low-resistance and highly transparent Ni/indium-tin oxide ohmic contacts to phosphorous-doped p-type ZnO,*" Applied Physics Letters, vol. 86, Article 211902, pp. 1-3 (May 16, 2005).

B.J. Coppa et al., "Structural, microstructural, and electrical properties of gold films and Schottky contacts on remote plasma-cleaned, n-type ZnO{0001} structures," Journal of Applied Physics, 2005, vol. 97, pp. 103517-103517-13.

H.L. Mosbacker et al., "Role of near-surface states in ohmic-Schottky conversion of Au contacts to ZnO," Appl. Phys. Lett., 2005, vol. 87, pp. 012102-012102-3.

G.I.N. Waterhouse et al., "Interaction of a polycrystalline silver powder with ozone," Surface and Interface Analysis, 2002, vol. 33, pp. 401-409.

H. Neff et al., "Structural, optical, and electronic properties of magnetronsputtered platinum oxide films," Journal of Applied Physics, 1996, vol. 79, pp. 7672-7675.

Raymond T. Tung, "Chemical Bonding and Fermi Level Pinning at Metal-Semiconductor Interfaces," Physical Review Letters, Jun. 26, 2002, vol. 84, No. 26, pp. 6078-6081.

Winfried Monch, "Barrier heights of real Schottky contacts explained by metal-induced gap states and lateral inhomogeneities," Journal of Vacuum Science Technology B, 1999, vol. 17, pp. 1867-1876.

B. Abay et al., "Barrier Characteristics of Cd/p-GaTe Schottky diodes based on I-V-T measurements," Semicond. Sci. Technol., 2003, vol. 18, pp. 75-81.

T. Hatakeyama et al., "Reverse Characteristics of a 4H-SiC Schottky Barrier Diode," Materials Science Forum, 2002, vol. 389, pp. 1169-1172.

F.A. Padovani et al., "Field and Thermionic-Field Emissions in Schottky Barriers," Solid-States Electronics, 1966, vol. 9, pp. 695-707.

H. Tanaka et al., "Electrical and optical properties of TCO-Cu2O heterojunction devices," Thin Solid Films, Dec. 22, 2004, vol. 469-470, pp. 80-85.

Han-Ki Kim et al., "Electrical and Interfacial Properties of Nonalloyed Ti/Au Ohmic and Pt Schottky Contacts on Zn-Terminated ZnO," Japanese Journal of Applied Physics, Mar. 1, 2006, vol. 45, No. 3A, pp. 1560-1565.

J. M. Nel et al., "Fabrication and characterization of NiO/ZnO structures," Sensors and Actuators B, Jun. 1, 2004, vol. 100, No. 1-2, pp. 270-276.

M. W. Allen et al., "Schottky contact behaviour as a function of metal and ZnO surface polarity," Proc. of the Fall 2006 Meeting of the Materials Research Society, (Nov. 26-Dec. 1, 2006, Boston, Massachusetts), vol. 957, 0957-K09-03.

L. J. Brillson et al., "Dominant effect of near-interface native point defects on ZnO Schottky barriers," Applied Physics Letters, Mar. 2007, vol. 90, pp. 102116-102116-3.

H. Endo et al., "Schottky ultraviolet photodiode using a ZnO hydrothermally grown single crystal substrate," Applied Physics Letters, Mar. 2007, vol. 90, pp. 121906-121906-3.

M.W. Allen et al., "ZnO Schottky diode performance as a function of Schottky metal and surface polarity," 2006 Electronic Material Conference, Jun. 28-30, 2006, State College, PA), 19 pages.

M.W. Allen et al., "ZnO Schottky diode performance as a function of surface polarity," 4th International Workshop on ZnO, Oct. 3-6, 2006, Giessen, Germany, 26 pages.

M. W. Allen et al., "High quality silver oxide Schottky devices on polar and non-polar zinc oxide," AMN-3, 3rd International Conference on Advanced Materials and Nanotechnology, Feb. 11-17, 2007, Wellington, New Zealand, 22 pages.

M.W. Allen et al., "Influence of surface polarity on the electrical and optical properties of bulk ZnO," Electronic Materials Conference, Jun. 20-22, 2007, Notre Dame, Indiana, 34 pages.

C.A. Mead, "Surface Barriers on ZnSe and ZnO," Physics Letters, Sep. 1, 1965, vol. 18, No. 3, pp. 218.

A.Y. Polyakov et al., "Electrical Characteristics of Au and Ag Schottky contacts on n-ZnO," Applied Physics Letters, 2003, vol. 83, pp. 1575-1577.

J. Chai et al., "Identification of a Deep Acceptor Level in ZnO Due to Silver Doping," Journal of Electronic Materials, 2010, vol. 39, No. 5, pp. 577-583.

M. Tachiki et al., "An Improved Laser Ablation Method Using a Shadow Mark (Eclipse Method)," Electrical Engineering in Japan, 2000, vol. 130, No. 1, pp. 88-94.

* cited by examiner

SCHOTTKY-LIKE CONTACT AND METHOD OF FABRICATION

This is a national stage of PCT/NZ08/000,109 filed May 19, 2008 and published in English, claiming benefit of U.S. provisional application No. 60/924,502, filed May 17, 2007, hereby incorporated by reference.

TECHNICAL FIELD

The present invention relates to optical and electronic devices. More particularly, the present invention relates to Schottky-like and ohmic contacts and to methods of forming such contacts.

BACKGROUND OF THE INVENTION

Zinc oxide is a II-VI semiconductor with considerable potential for optoelectronic applications in the UV spectrum due to its wide direct band gap (3.4 eV at 300 K), high exciton binding energy (60 meV), and excellent radiation hardness.

Zinc oxide can be grown using a variety of techniques, and bulk single crystal wafers are available from a number of different manufacturers. Bulk growth techniques used by manufacturers include seeded chemical vapor growth, melt growth and hydrothermal growth. Of these, hydrothermal growth results in material of significantly lower carrier concentration and higher resistivity compared to other growth techniques Like gallium nitride, zinc oxide crystallizes into the wurtzite structure with a c:a ratio lower than that for perfectly hexagonally close-packed atoms (c:a=1.6020 for zinc oxide and 1.6333 for hcp). This, together with a lack of inversion symmetry and the ionic nature of the Zn—O bond, produces a net dipole moment along the c axis of the unit cell.

When zinc oxide is cleaved normal to the c axis it forms a Zn-polar (0001) face whose outer plane consists entirely of zinc atoms and an opposite O-polar (000$\bar{1}$) face consisting of an outer plane of oxygen atoms. Zinc oxide has a large spontaneous polarization ($-0.057 \, Cm^{-2}$) along the c axis due to the net effect of internal dipole moments.

Schottky contacts to zinc oxide were first reported in 1965 on vacuum cleaved n-type surfaces (see C. A. Mead, *Phys Lett.* 18 218 (1965)). Since then an increasing amount of research has been carried out using gold, silver, platinum and palladium as the Schottky metals. The majority of the reported barrier heights are in the range 0.6-0.8 eV, with the quality of the zinc oxide material and the surface treatment seemingly more important than the metal used (see A. Y. Polyakov et al., *Appl. Phys Lett.* 83 1575 (2003)).

It is well known that the condition of the semiconductor surface is critical to the performance of Schottky contacts, with many possible influences such as surface morphology, surface states, metal-surface chemical reactions, hydrocarbon and hydroxide surface contamination, oxygen chemisorption, and subsurface defects. Another potential variable is the polarity of the zinc oxide surface. Nonzero net dipole moments occur perpendicular to the Zn-polar (0001) and O-polar (000$\bar{1}$) surfaces, which may lead to differences in the interface structure of Schottky contacts and may also affect some of the surface factors listed above.

Coppa et al. (*J. Appl. Phys* 97 103517 (2005)) reported no significant surface polarity related effects on the improvement of the rectifying properties of gold contacts on the (0001) and the (000$\bar{1}$) surfaces of bulk zinc oxide wafers following remote oxygen/helium plasma cleaning at 525-550° C. This improvement was attributed to the removal of hydrocarbon and hydroxide contamination and also the surface chemisorption of oxygen species following cooling in the unignited plasma ambient. Mosbacker et al. (*Appl. Phys. Lett.* 87 012102 (2005)) reported a conversion from ohmic to rectifying behavior of gold contacts on bulk zinc oxide following remote room temperature oxygen/helium plasma treatment which was almost identical on the Zn-polar and O-polar faces. This was again attributed to removal of a carbon and hydroxide accumulation layer from the zinc oxide surface plus the removal of near surface defects and donors.

It is an object of the present invention to provide an improved Schottky-like or ohmic contact; and/or to at least provide the public with a useful choice.

Other objects of the invention may become apparent from the following description which is given by way of example only.

Any discussion of documents, acts, materials, devices, articles or the like which has been included in the present specification is solely for the purpose of providing a context for the present invention. It is not to be taken as an admission that any or all of these matters form part of the prior art base or were common general knowledge in the field relevant to the present invention as it existed before the priority date.

SUMMARY OF THE INVENTION

In a first aspect, the present invention provides a Schottky-like contact comprising a substrate that comprises zinc oxide material and a conducting layer joined to the substrate to define a rectifying barrier at the junction of the substrate and the conducting layer, wherein the conducting layer comprises a conducting metal oxide.

In a further aspect, the present invention provides a Schottky-like contact comprising a substrate that comprises zinc oxide material and a conducting layer joined to the substrate to define a rectifying barrier at the junction of the substrate and the conducting layer, wherein the conducting layer comprises a conducting metal oxide, and wherein the metal oxide is not silver oxide.

In another aspect, the present invention provides a semiconductor device comprising a substrate that comprises p-type zinc oxide material and a conducting layer joined to the substrate to define an ohmic contact at the junction of the substrate and the conducting layer, wherein the conducting layer comprises a conducting metal oxide.

In another aspect, the present invention provides a semiconductor device comprising a substrate that comprises p-type zinc oxide material and a conducting layer joined to the substrate to define an ohmic contact at the junction of the substrate and the conducting layer, wherein the conducting layer comprises a conducting metal oxide, wherein the metal oxide is not silver oxide.

In one embodiment, the Schottky-like or ohmic contact further comprises a metallic capping layer. Preferably, the metallic capping layer comprises platinum, gold or silver.

In one embodiment, the Schottky-like contact further comprises one or more separate ohmic contacts.

In another aspect, the present invention provides a method of forming a Schottky-like contact comprising the steps:
(a) providing a substrate that comprises zinc oxide material; and
(b) fabricating a layer comprising a conducting metal oxide on the substrate to form a rectifying barrier junction between the metal oxide layer and the zinc oxide material.

In another aspect, the present invention provides a method of forming a Schottky-like contact comprising the steps:

(a) providing a substrate that comprises zinc oxide material; and
(b) fabricating a layer comprising a conducting metal oxide on the substrate to form a rectifying barrier junction between the metal oxide layer and the zinc oxide material, wherein the conducting metal oxide is not silver oxide. Optionally, the zinc oxide material is n-type doped.

In another aspect, the present invention provides a method of forming an ohmic contact comprising the steps:
(a) providing a substrate that comprises p-type zinc oxide material; and
(b) fabricating a layer comprising a conducting metal oxide on the substrate to form an ohmic junction between the metal oxide layer and the p-type zinc oxide material.

In another aspect, the present invention provides a method of forming an ohmic contact comprising the steps:
(a) providing a substrate that comprises p-type zinc oxide material; and
(b) fabricating a layer comprising a conducting metal oxide on the substrate to form an ohmic junction between the metal oxide layer and the p-type zinc oxide material, wherein the conducting metal oxide is not silver oxide.

In one embodiment, the substrate is bulk grown zinc oxide material. Alternatively, the substrate may be a film of zinc oxide material grown on a secondary substrate.

In one embodiment, the zinc oxide material is a ternary oxide. Preferably, the ternary oxide is selected from the group consisting of: zinc cadmium oxide; zinc beryllium oxide; zinc magnesium oxide; zinc selenium oxide; zinc tellurium oxide; zinc sulfur oxide; and alloys thereof.

In one embodiment, the conducting metal oxide layer is joined to or fabricated on the Zn-polar (0001) face, or the non-polar a-plane (11$\bar{2}$0) or m-plane (1$\bar{1}$00) face of the zinc oxide material.

In one embodiment, the conducting metal oxide has a metal atomic fraction that is higher than the stoichiometric fraction.

In one embodiment, the conducting metal oxide is selected from the group consisting of: silver oxide; iridium oxide; platinum oxide; and copper oxide.

In one embodiment, the conducting metal oxide is silver oxide. Preferably, the silver atomic fraction is at least about 85%.

In one embodiment, the conducting metal oxide is selected from the group consisting of: iridium oxide; platinum oxide; and copper oxide. In another embodiment, the conducting metal oxide is selected from iridium oxide and platinum oxide. In another embodiment, the conducting metal oxide is iridium oxide. Preferably, the iridium atomic fraction is at least about 76%. In another embodiment, the conducting metal oxide is platinum oxide. Preferably, the platinum atomic fraction is at least about 83%. In another embodiment, the conducting metal oxide is copper oxide. Preferably, the copper atomic fraction is at least about 68%.

Preferably, the metal oxide layer is fabricated in a reactive oxygen ambient. In one embodiment, the metal oxide layer is fabricated by depositing the metal oxide onto the zinc oxide material. Preferably, the metal oxide is deposited onto the zinc oxide material using reactive RF sputtering or pulsed laser deposition. Preferably, the metal oxide layer is deposited under metal rich growth conditions.

In an alternative embodiment, the metal oxide layer is fabricated by oxidizing a thin film of metal deposited on the zinc oxide material substrate.

In one embodiment, the substrate is ultrasonically cleaned in an organic solvent or mixture of organic solvents prior to fabricating the layer comprising a conducting metal oxide.

In one embodiment, lift-off photolithographic techniques are used to fabricate a patterned layer of conducting metal oxide on the substrate. Preferably, the substrate is spin-coated with a photoresist and the patterned array of the metal oxide contacts is exposed and then developed. A preferred photolithographic developer is tetramethylammonium hydroxide.

In one embodiment, the method further comprises depositing a metallic capping layer on the conducting metal oxide. Preferably, the metallic capping layer comprises platinum, gold or silver.

In one embodiment, the method of forming a Schottky-like contact further comprises fabricating one or more separate ohmic contacts on the substrate.

In another aspect, the present invention provides a Schottky-like contact when formed by a method of the invention.

Preferably, the ideality factor of the Schottky-like contact is less than about 1.50, more preferably less than about 1.40, more preferably less than about 1.30, more preferably less than about 1.20, more preferably less than about 1.10. Preferably, the effective barrier height is at least about 0.8 eV.

In another aspect, the present invention provides an ohmic contact when formed by a method of the invention.

This invention may also be said broadly to consist in the parts, elements and features referred to or indicated in the specification of the application, individually or collectively, and any or all combinations of any two or more said parts, elements or features, and where specific integers are mentioned herein which have known equivalents in the art to which this invention relates, such known equivalents are deemed to be incorporated herein as if individually set forth.

The term "comprising" as used in this specification means "consisting at least in part of". When interpreting each statement in this specification that includes the term "comprising", features other than that or those prefaced by the term may also be present. Related terms such as "comprise" and "comprises" are to be interpreted in the same manner.

Although the present invention is broadly, as defined above, those persons skilled in the art will appreciate that the invention is not limited thereto and that the invention also includes embodiments of which the following description gives examples.

BRIEF DESCRIPTION OF THE DRAWINGS

The invention will now be described with reference to the Figures in which.

DETAILED DESCRIPTION OF THE INVENTION

Figure 1:
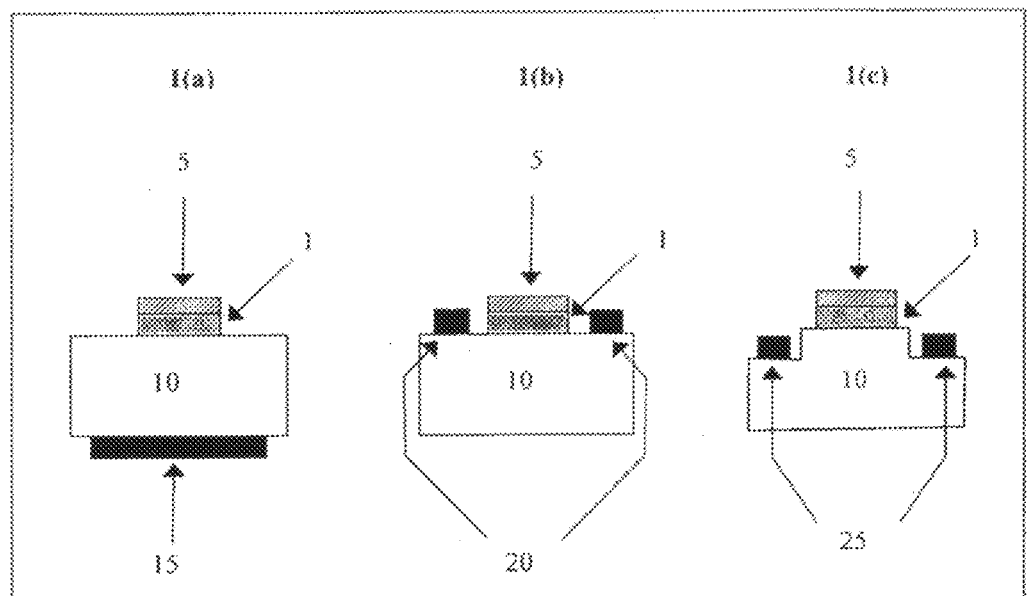
FIG. 1 shows a cross-section view of three geometries of diodes comprising metal oxide Schottky-like contacts on zinc oxide materials.

As used herein, the term "Schottky-like contact" is intended to mean a device comprising a semiconducting substrate having a conducting layer formed thereon to define a "rectifying barrier junction" between the semiconductor and the conducting layer.

In a first aspect, the present invention provides a Schottky-like contact comprising a substrate that comprises zinc oxide material and a conducting layer joined to the substrate to define a rectifying barrier at the junction of the substrate and the conducting layer, wherein the conducting layer comprises a conducting metal oxide.

In a further aspect, the present invention provides a Schottky-like contact comprising a substrate that comprises zinc oxide material and a conducting layer joined to the substrate to define a rectifying barrier at the junction of the substrate and the conducting layer, wherein the conducting layer comprises a conducting metal oxide, and wherein the metal oxide is not silver oxide.

Depending on the intended application, the Schottky-like contact of the invention may further comprise a metallic capping layer and/or one or more separate ohmic contacts. The capping layer and ohmic contacts function as terminals for applying a potential across the rectifying barrier junction between the zinc oxide material and the conducting metal oxide layer.

The present invention discloses a method of forming high quality Schottky-like contacts using conducting metal oxides.

Accordingly, in another aspect, the present invention provides a method of forming a Schottky-like contact comprising the steps:

(a) providing a substrate that comprises zinc oxide material; and (b) fabricating a layer comprising a conducting metal oxide on the substrate to form a rectifying barrier junction between the metal oxide layer and the zinc oxide material.

In another aspect, the present invention provides a method of forming a Schottky-like contact comprising the steps:

(a) providing a substrate that comprises zinc oxide material; and (b) fabricating a layer comprising a conducting metal oxide on the substrate to form a rectifying barrier junction between the metal oxide layer and the zinc oxide material, wherein the conducting metal oxide is not silver oxide.

As used herein, the term "zinc oxide material" is intended to include zinc oxide, as well as ternary oxides of various stoichiometries, including but not limited to: zinc cadmium oxide; zinc beryllium oxide; zinc magnesium oxide; zinc selenium oxide; zinc tellurium oxide; zinc sulfur oxide; and various alloys of these ternary oxides.

The use of ternary oxides provides a degree of control of the bandgap energy for the zinc oxide material. In addition, other properties of the ternary oxides, such as lattice constant and the index of refraction, may be relevant for controlling the growth of the zinc oxide material and for laser fabrication, respectively.

The substrate may be bulk grown zinc oxide material or a film of zinc oxide material grown on a secondary substrate. The zinc oxide material may be in any form including amorphous, crystalline, nanocrystalline and polycrystalline.

Suitable secondary substrates are known to those persons skilled in the art and include bulk crystals, which can act as a template for an epitaxially grown crystalline film of zinc oxide material or as a support for zinc oxide material in another form, and mechanical support structures onto which a layer of zinc oxide material may be transferred after growth or deposition. Examples of suitable secondary substrates include, but are not limited to: plastic; silicon; glass; $SiO_2$; sapphire; and gallium nitride.

The zinc oxide material can be produced as a thin film or a bulk grown material, including crystals, by conventional techniques including, but not limited to: hydrothermal bulk growth; melt bulk growth; seeded chemical vapor bulk growth; metal-organic chemical vapor deposition (MOCVD); molecular beam expitaxy (MBE); sol-gel deposition; DC and/or RF magnetron sputtering; reactive evaporation; spray pyrolysis; and pulsed laser deposition. Suitable zinc oxide materials are known and are also commercially available.

The zinc oxide material can be intentionally or unintentionally doped or undoped. In some embodiments, at least the surface layers of the zinc oxide material are modified by known doping techniques.

The use of n-type doped zinc oxide material as the substrate may be advantageous in those embodiments wherein the Schottky-like contact is used in the fabrication of a diode. The doped zinc oxide material may lower the series resistance of the diode and enable it to pass more current in the forward direction.

Those persons skilled in the art will appreciate that the junction between a conducting layer and a semiconductor substrate results in a Schottky-like contact if the barrier height, $\Phi_B$, is positive. The junction results in an ohmic contact if the barrier height is zero or negative. Accordingly, a conducting layer that provides a good Schottky-like contact on an n-type zinc oxide material substrate will provide a good ohmic contact on a p-type zinc oxide material substrate.

Accordingly, in another aspect, the present invention provides a semiconductor device comprising a substrate that comprises p-type zinc oxide material and a conducting layer joined to the substrate to define an ohmic contact at the junction of the substrate and the conducting layer, wherein the conducting layer comprises a conducting metal oxide.

In another aspect, the present invention provides a semiconductor device comprising a substrate that comprises p-type zinc oxide material and a conducting layer joined to the substrate to define an ohmic contact at the junction of the substrate and the conducting layer, wherein the conducting layer comprises a conducting metal oxide, wherein the metal oxide is not silver oxide.

In another aspect, the present invention provides a method of forming an ohmic contact comprising the steps:
(a) providing a substrate that comprises p-type zinc oxide material; and
(b) fabricating a layer comprising a conducting metal oxide on the substrate to form an ohmic junction between the metal oxide layer and the p-type zinc oxide material.

In another aspect, the present invention provides a method of forming an ohmic contact comprising the steps:
(a) providing a substrate that comprises p-type zinc oxide material; and
(b) fabricating a layer comprising a conducting metal oxide on the substrate to form an ohmic junction between the metal oxide layer and the p-type zinc oxide material, wherein the conducting metal oxide is not silver oxide.

The selection of surface orientation of the zinc oxide material may affect the performance of devices comprising the Schottky-like contact or ohmic contact of the invention due to, for example, polarization charge effects and differences in surface stoichiometry and roughness. Utilizing the methods disclosed herein, high quality metal oxide Schottky-like contacts have been formed on all the common polar and non-polar faces of zinc oxide.

However, the surface orientation of the zinc oxide material provides another degree of freedom in forming the Schottky-like and ohmic contacts of the invention. Key performance indicators for the contacts, such as barrier height and ideality factor, can vary between the different surface orientations of the zinc oxide material. For example, improved performance has been observed for diodes comprising metal oxide Schottky-like contacts on the Zn-polar (0001) face of zinc oxide, and to a lesser extent the non-polar a-plane (11$\bar{2}$0) and m-plane (1$\bar{1}$00) faces, when compared to diodes comprising metal oxide Schottky-like contacts on the O-polar (000$\bar{1}$) face.

Conducting metal oxides are known to those persons skilled in the art. By way of example only, conducting metal oxides include various transition metal oxides such as silver oxide, nickel oxide, ruthenium oxide, iridium oxide, platinum oxide, rhenium oxide, osmium oxide, rhodium oxide, molybdenum oxide, vanadium oxide, copper oxide, palladium oxide and tungsten oxide.

In one embodiment of the invention, the conducting metal oxide is selected from the group consisting of: silver oxide; iridium oxide; platinum oxide; and copper oxide. In another embodiment, the conducting metal oxide is selected from the group consisting of: iridium oxide; platinum oxide; and copper oxide. In another embodiment of the invention, the conducting metal oxide is iridium oxide or platinum oxide.

In another embodiment, the conducting metal oxide is iridium oxide. In another embodiment, the conducting metal oxide is platinum oxide. In another embodiment, the conducting metal oxide is copper oxide.

In one embodiment, the conducting metal oxide has an oxygen atomic fraction that is less than the stoichiometric fraction. Such metal oxides are also known as substoichiometric (or metal rich) metal oxides.

The metal oxide layer may be fabricated on the zinc oxide material using a number of methods that are familiar to those persons skilled in the art.

In one embodiment, the metal oxide layer is fabricated by deposition of the metal oxide onto the zinc oxide material. Suitable deposition techniques include, but are not limited to: RF sputtering; DC sputtering; pulsed laser deposition; molecular beam epitaxy; and various physical and chemical vapor deposition techniques.

Sputtering is a vacuum based vapor deposition technique in which particles (atoms and atomic clusters) are ejected from a target by the bombardment of accelerated inert gas ions (usually argon ions) created in a RF or DC plasma. Reactive sputtering involves the addition of a second non-inert gas, such as oxygen, which reacts with the ejected particles, either though in-flight collisions or on the substrate itself.

Pulsed laser deposition (PLD) is a thin film deposition technique in which a high power pulsed laser beam is focused inside a vacuum chamber to strike a target. The material vaporized from the target expands into the surrounding vacuum in the form of a plume containing many energetic species including atoms, molecules, electrons, ions, clusters, particulates and molten globules, before depositing as a thin film on a substrate facing the target. This process can occur in ultra high vacuum or in the presence of oxygen to deposit an oxide film.

The reactive RF sputtering and pulsed laser deposition PLD techniques generate a plasma/plume containing reactive oxygen species, e.g. charged oxygen ions, oxygen radicals, and excited molecular and atomic oxygen. These reactive oxygen species are likely to be efficient scavengers of hydrogen from the hydroxide layers which terminate the zinc oxide surface in vacuum conditions.

Without wishing to be bound by theory, it is thought that the removal of hydrogen from the zinc oxide surface in reactive oxygen ambients may avoid the creation of oxygen vacancies. The reactive oxygen species may even neutralise intrinsic near surface oxygen vacancies and oxygen vacancies introduced by the metallization. Oxygen vacancies are intrinsic donors which can increase the conductivity of the surface.

In an alternative embodiment, the metal oxide layer is fabricated by oxidizing a thin film of metal deposited on the zinc oxide material substrate. Methods for depositing thin films of metal are familiar to those persons skilled in the art. Such films may be oxidized by, for example, annealing in an oxygen rich ambient or using ozone gas.

In a preferred embodiment, the metal oxide layer is fabricated by depositing the metal oxide onto the zinc oxide material using reactive RF sputtering or pulsed laser deposition.

In a preferred embodiment, the metal oxide is silver oxide and the silver oxide layer is fabricated by depositing silver oxide onto the zinc oxide material substrate using reactive RF sputtering. In this embodiment, a silver metal target and oxygen-containing plasma are used to provide the silver oxide layer.

In another preferred embodiment, the metal oxide is copper oxide and the copper oxide layer is fabricated by depositing copper oxide onto the zinc oxide material substrate using reactive RF sputtering. In this embodiment, a copper metal target and oxygen-containing plasma are used to provide the copper oxide layer.

In another preferred embodiment, the metal oxide is iridium oxide and the iridium oxide layer is fabricated by depositing iridium oxide onto the zinc oxide material substrate using pulsed laser deposition. In this embodiment, an iridium metal target and oxygen atmosphere are used to provide the iridium oxide layer.

In another preferred embodiment, the metal oxide is platinum oxide and the platinum oxide layer is fabricated by depositing platinum oxide onto the zinc oxide material substrate using pulsed laser deposition. In this embodiment, a platinum metal target and oxygen atmosphere are used to provide the iridium oxide layer.

In a preferred embodiment, wherein the conducting metal oxide layer is fabricated by depositing the metal oxide onto the zinc oxide material, the metal oxide layer is deposited under metal rich growth conditions, such that the deposited oxide is metal rich with a higher metal atomic fraction than that expected for the stoichiometric metal oxide.

In one embodiment, the metal atomic fraction in the conducting metal oxide is at least about 68%. In another embodiment, wherein the conducting metal oxide is silver oxide, the atomic silver fraction is at least about 85%. In another embodiment, wherein the conducting metal oxide is iridium oxide, the atomic iridium fraction is at least about 76%. In another embodiment, wherein the conducting metal oxide is platinum oxide, the atomic platinum fraction is at least about 83%. In another embodiment, wherein the conducting metal oxide is copper oxide, the atomic copper fraction is at least about 68%.

Those persons skilled in the art will appreciate that the metal atomic fractions determined for a particular metal oxide on a particular substrate may vary depending on the method of analysis. In those embodiments of the invention reciting specific metal atomic fractions, the metal atomic fractions are as determined by the particular X-ray photoelectron spectroscopic techniques described herein.

The steps used in one non-limiting exemplary embodiment of a method of forming metal oxide Schottky-like contacts on a zinc oxide wafer described herein are:
1. ultrasonically assisted cleaning of zinc oxide wafer in organic solvents e.g. acetone, methanol, isopropyl alcohol;
2. lift-off photolithographic patterning and exposure of metal oxide contact geometry using spin-on photoresist;
3. metal oxide contact geometry developed using tetramethylammonium hydroxide and deionized water;
4. deposition of metal oxide, e.g. by reactive RF sputtering or pulsed laser deposition; and
5. lift off of excess metal oxide using acetone and ultrasonic agitation.

In those embodiments wherein the method is directed to forming a Schottky-like diode comprising the metal oxide Schottky-like contact, the method further comprises:
6. fabrication of ohmic contacts, e.g. by using the same lift-off photolithography method used for the metal oxide contacts.

The zinc oxide substrate is cleaned prior to fabricating the metal oxide layer. Conventional cleaning processes utilize special surface etching, annealing or oxidation treatments such as: chemical etching followed by ultra pure water rinses; high temperature gas etching with hydrogen and hydrogen chloride gas; RF sputter cleaning in an inert gas atmosphere; and either high temperature or room temperature oxygen plasma treatments. These conventional cleaning processes can also be used to clean the zinc oxide material substrate for use in the method of the present invention.

Advantageously, however, the present inventors have determined that zinc oxide material substrates for use in the method of the present invention can be cleaned without using any special surface treatments. Accordingly, in one embodiment the zinc oxide material substrate is ultrasonically cleaned in an organic solvent or mixture of organic solvents.

In one embodiment, the zinc oxide material substrate is a zinc oxide wafer, and the as-received wafer is ultrasonically pre-cleaned for five minutes in warm acetone then rinsed in methanol, isopropyl alcohol and dried in nitrogen. The selection of organic solvents is not critical to the fabrication method and depends on the cleanliness of the zinc oxide material. Other solvents, e.g. trichloroethylene and ethanol, may also be used.

In the exemplary embodiment, a patterned layer of metal oxide is fabricated by metal oxide deposition and lift-off photolithographic techniques.

In one embodiment, the pre-cleaned zinc oxide wafer is spin-coated with a photoresist and the patterned array of the metal oxide contacts is exposed and then developed.

In a preferred embodiment, the photolithographic developer is tetramethylammonium hydroxide. Without wishing to be bound by theory, it appears that tetramethylammonium hydroxide further cleans the surface of the zinc oxide substrate prior to fabrication of the metal oxide layer. In particular, tetramethylammonium hydroxide aids the removal of any carbon contamination from the surface of the zinc oxide substrate.

In the exemplary embodiment, a metal oxide layer is then deposited on the developed patterned array.

In one embodiment, the metal oxide layer is deposited by reactive RF sputtering, preferably using an argon:oxygen plasma. In one embodiment, wherein the metal oxide is silver oxide, the RF power is 50 W RMS. In another embodiment, wherein the metal oxide is copper oxide, the RF power is 100 W RMS. The use of a relatively low RF power may provide the formation of smoother metal oxide contacts on the zinc oxide wafer. However, other RF powers may be used.

In one embodiment, wherein the metal oxide is silver oxide, the processing pressure is approximately $4 \times 10^{-3}$ mbar and the argon:oxygen gas flow rate is 10.0 sccm:1.70 sccm, where sccm denotes cubic centimeters per minute at STP. However, the argon:oxygen gas flow rate may be varied and high quality silver oxide Schottky-like contacts have been formed using the methods described herein with argon:oxygen gas flow rates over the range 10.0 sccm:1.25 sccm to 10.0 sccm:2.10 sccm. In addition, higher or lower argon:oxygen gas flow rates outside of this range may be used.

Advantageously, the use of an oxygen-containing plasma provides some control of the stoichiometry of the deposited metal oxide layer. For example, increasing the relative, flow of oxygen in the plasma will increase the atomic concentration of oxygen in the metal oxide layer.

Other parameters—for example: flow rates and temperatures of gas sources; metal evaporation rates; RF power; substrate temperature and surface stoichiometry; and the deliberate use of ozone—may also influence the stoichiometry of the deposited metal oxide. For example, in those embodiments wherein the zinc oxide material is a hydrothermally grown, bulk, single crystal zinc oxide wafer, a slightly higher relative flow rate of oxygen may be preferred than when the zinc oxide material is a melt grown, bulk, single crystal zinc oxide wafer. Those persons skilled in the art will be able to select the appropriate conditions for metal oxide deposition by reactive RF sputtering without undue experimentation.

Utilizing the methods disclosed herein, high quality silver oxide Schottky-like contacts have been formed with silver:oxygen atomic concentration ratios up to approximately 85:15. The invention also contemplates the formation of silver oxide Schottky-like contacts with higher silver:oxygen atomic concentration ratios.

In one embodiment, the metal oxide layer is deposited by pulsed laser deposition (PLD). In one embodiment, wherein the metal oxide is iridium oxide or platinum oxide, the metal oxide is deposited by the ablation of a rotating, high purity metal target by a KrF excimer laser ($\lambda$=248 nm) in an oxygen atmosphere.

In one embodiment, the pulsed laser deposition is by eclipse-PLD in which a shadow mask is used to limit the incorporation of metal droplets into the metal oxide film.

In one embodiment, the base pressure for the pulsed laser deposition is $10^{-5}$ mTorr and the ambient oxygen processing atmosphere is established at a pressure of 50 or 100 mTorr.

Variation of the pressure of the ambient oxygen processing atmosphere provides some control of the stoichiometry of the deposited metal oxide layer.

Other parameters—for example: laser wavelength; laser spot size and fluence; pulse rate; substrate temperature; and substrate surface stoichiometry—may also influence the stoichiometry of the deposited metal oxide. Those persons skilled in the art will be able to select the appropriate conditions for metal oxide deposition by pulsed laser deposition without undue experimentation.

Optionally, a capping layer may be deposited on top of the metal oxide film to function as a terminal for applying a potential across the rectifying barrier junction between the zinc oxide material and the conducting metal oxide layer.

Suitable materials for the capping layer include platinum, gold and silver, but are not limited thereto. In one embodiment, wherein the capping layer is platinum, the capping layer is deposited on top of the metal oxide film by electron beam evaporation.

The final step of the exemplary embodiment is lifting off of the excess metal oxide or of the excess metal oxide/capping material bi-layer.

In one embodiment, ultrasonically agitated acetone is used for lift off.

In the those embodiments wherein the method is directed to forming a Schottky-like diode comprising the metal oxide Schottky-like contact on an n-type zinc oxide material substrate, the method further comprises fabricating ohmic contacts.

Suitable ohmic contacts are known to those persons skilled in the art. In one embodiment, the ohmic contacts are fabricated around the metal oxide Schottky-like contacts using conventional lift-off photolithography and electron beam evaporation techniques.

In one embodiment, the Schottky-like diode has a circular pattern, in which the inner circle is the metal oxide Schottky-like contact and the outer ring is an ohmic contact. In a preferred embodiment, the metal oxide Schottky-like contact has a diameter of about 350 μm and the ohmic contacts comprise annular rings having an inside diameter of about 400 μm and an outside diameter of about 600 μm. In another preferred embodiment, the metal oxide Schottky-like contact has a diameter of about 300 μm and the ohmic contacts comprise annular rings having an inside diameter of about 350 μm and an outside diameter of about 550 μm. In these embodiments, the annular gap between the Schottky-like and ohmic contacts is 25 μm. However, the Schottky-like contact diameter and annular gap are not critical and a wide range of contact diameters and separations between the Schottky-like contact and the ohmic contact can be used.

Those persons skilled in the art will appreciate that the Schottky-like contact and the ohmic contact are not limited to this geometry and that other geometries are possible.

Geometries for the Schottky-like diode that are contemplated by the present invention include, but are not limited to, the three geometries shown in FIG. 1. FIG. 1(a) shows a cross-section of a vertical geometry Schottky-like diode on a zinc oxide material substrate (10) comprising a metal oxide rectifying contact (1) with an optional metal (for example, platinum, gold or silver) capping layer (5) and a bottom ohmic contact (for example, titanium/aluminum/platinum) (15) of any suitable dimension. The Schottky-like diode shown in FIG. 1(b) varies from that shown in FIG. 1(a) in that it comprises a top ohmic contact (20) of any suitable dimension. Similarly, the Schottky-like diode shown in FIG. 1(c) comprises a mesa or side ohmic contact (25) of any suitable dimension.

The following non-limiting examples are provided to illustrate the present invention and in no way limit the scope thereof.

EXAMPLES

1. Metal Oxide Growth and Characterization (a) Silver Oxide

Reactive RF sputtering was used to grow a series of 80 nm thick, silver oxide films on organic solvent cleaned, quartz substrates (10 mm×10 mm×0.5 mm). To avoid target poisoning, the target was thoroughly pre-sputtered in an argon atmosphere before each growth to remove ~200 nm of the surface.

For the silver oxide growth, a 3.0 inch×0.250 inch silver target (purity >99.99%) was used in the RF source of a B.O.C. Edwards RF/DC magnetron sputterer. The vacuum chamber was pumped down to a base pressure of $\sim 1.0\times 10^{-5}$ mbar before processing. The processing gas consisted of an argon/oxygen gas mixture in which the argon flow was fixed at 10.00 sccm (where sccm denotes cubic centimeter per minute at standard temperature and pressure) and the oxygen flow rate was varied from 0 to 2.40 sccm. Each film was grown for 5 minutes at an RF power of 50 W RMS and a processing pressure of $\sim 4\times 10^{-3}$ mbar.

The appearance of all of the silver oxide films resulting from a compositional sweep with oxygen flow rates from 1.05 to 2.10 sccm was significantly different from that of a highly reflective, pure metallic silver film of the same thickness. The films grown with low oxygen flow rates were grayish in appearance, while those grown with high oxygen flow rates were brown. The 1.45 and 1.70 sccm oxygen flow rate films had a yellow/brown appearance and were the most transparent.

The composition of these films was investigated by X-ray photoelectron spectroscopy (XPS) using a Kratos XSAM instrument.

The surface of the as-grown '1.70 sccm $O_2$' silver oxide film was heavily oxidized, due to post-growth exposure to air, with an O/Ag atomic fraction of 0.792. The film was in situ sputtered for 4 minutes using a 2.4 keV Ar ion source to remove the heavily oxidized surface layers. No aluminum was detected, indicating that the quartz substrate was not being sampled. The surface carbon contamination was completely removed and a decrease in the O/Ag atomic fraction to 0.104 was measured, which is more representative of the bulk of the film.

TABLE 1

Fractional O/Ag atomic composition of silver oxide films grown by reactive RF sputtering.

| $O_2$ flow rate (sccm) | O/Ag fraction |
|---|---|
| 1.05 | 0.062 |
| 1.25 | 0.065 |
| 1.45 | 0.075 |
| 1.70 | 0.104 |
| 1.90 | 0.125 |
| 2.10 | 0.153 |

Table 1 shows the bulk composition for the other silver oxide films in the series, determined in the same way. All of the films were silver rich with O/Ag atomic fractions significantly less than the values of 0.33 and 0.50 expected for stoichiometric $Ag_2O$ and AgO films, respectively.

The XPS measurements were repeated on a '1.70 sccm $O_2$' silver oxide film grown on the Zn-polar face of a hydrothermal zinc oxide wafer. This time an O/Ag atomic fraction of ~0.04 was estimated from an XPS survey scan after 5 minutes of 2.4 keV argon ion sputter cleaning. A high resolution scan of the core-level O 1s spectrum was obtained and interpreted with reference to an, XPS study of oxidized silver powders by Waterhouse et al. (*Surf. Interface Anal.* 33 401 (2002)). Three main peaks were identified at 530.7, 529.2, and 528.3 eV, which are due to subsurface oxygen, $Ag_2O$ and AgO respectively. The scan suggested that the bulk of the film was highly silver rich, but still contained a mixed oxide phase.

The valence band XPS spectrum of the sputter-cleaned '1.70 sccm $O_2$' silver oxide film grown on the Zn-polar face of a hydrothermal zinc oxide wafer was obtained. Since the film was grounded to the spectrometer, the zero of the binding energy scale represented its Fermi level ($E_F$). The film had a continuous density of states (DOS) near $E_F$, similar to that observed for a sputter-cleaned silver reference sample, indicating that the silver oxide film had a metallic-like nature.

(b) Iridium Oxide

For Schottky-like contact fabrication on bulk zinc oxide, iridium oxide films were grown by pulsed laser deposition (PLD) via the ablation of a rotating, high purity iridium target by a KrF excimer laser ($\lambda$=248 nm) in an oxygen atmosphere.

The zinc oxide substrates were cleaned as described below for the preparation of the silver oxide Schottky-like contacts and mounted on an unheated stainless steel block in a high vacuum chamber which was evacuated to a base pressure of $10^{-5}$ mTorr. An ambient oxygen processing atmosphere was established at pressures of 50 and 100 mTorr. The KrF laser was focused onto the iridium target at a 45° angle with a 2 $mm^2$ spot size and a fluence of 15-20 $Jcm^{-2}$. Each film was grown for 1 hour at a pulse rate of 10 Hz. A high fluence was required due to the reflectivity and high melting point (2739 K) of the iridium target. This increased the likelihood of superheated explosive droplets being ejected from the target (M. Tachiki and T. Kobayashi, *Electr. Eng. Jpn* 130 88 (2000)). To limit the incorporation of these droplets into the iridium oxide film, a 10 mm×10 mm square shadow mask was placed 17 mm in front of the substrate, directly in the line of sight of the target. The target-substrate distance was 50 mm. This technique is usually referred to as eclipse-PLD in which the deposition is ideally limited to the diffusion of atoms, molecules and clusters around the shadow mask.

Two iridium oxide films were grown for 1 hour each by eclipse-PLD with ambient oxygen pressures of 50 and 100 mTorr using the same KrF laser fluence. The thickness of the resulting '50 mTorr $O_2$' and '100 mTorr $O_2$' iridium oxide films was determined by AFM step-height analysis to be ~55 nm (with an estimated RMS roughness of ~2.5 nm) and ~160 nm respectively, indicating a faster diffusion rate of the ejected particles in the higher $O_2$ pressure ambient.

The composition of the two films was determined from XPS survey scans taken after a 3-4 minute sputter clean, using 2.4 keV Ar ions, to remove the more heavily oxidized surface layers. The atomic O/Ir fraction of the 50 mTorr $O_2$ film was 0.24 compared to 0.11 for the 100 mTorr $O_2$, with the slower growth rate of the former perhaps allowing more time for oxygen incorporation. However, these 0/Ir atomic fractions are still significantly less than the stoichiometric value of 0.67 for $IrO_2$ indicating that the films were both iridium rich.

The valence band XPS spectrum collected from the sputter cleaned 50 mTorr $O_2$ and 100 mTorr $O_2$ films indicated metallic like conduction. These iridium oxide films were found to have good lateral conductivity. Consequently, good electrical contact could be made to these films without the need for a metallic capping layer.

(c) Platinum Oxide

For Schottky-like contact fabrication, platinum oxide films were grown on bulk zinc oxide using the same eclipse-PLD technique used for the growth of iridium oxide. Apart from the use of a high purity platinum target and an ambient oxygen pressure of 100 mTorr, all growth conditions and parameters were the same as described above. The platinum oxide film was grown for 1 hour and had a thickness (from AFM step-height analysis) of 240 nm (with an RMS surface roughness of 2.5-3.0 nm).

The composition of the platinum oxide film was determined from an XPS survey scan taken after a 4 minute argon ion sputter clean. The O/Pt fraction was ~0.17 indicating a platinum rich film. The valence band XPS spectrum showed a high density of states near the Fermi level which is characteristic of strong catalysts (H. Neff et al. *J. Appl. Phys* 79 7672 (1996)) and indicates a metallic rather than semiconducting nature.

(d) Copper Oxide

For Schottky-like contact fabrication, copper oxide films were fabricated on bulk zinc oxide by the reactive RF sputtering of a high purity copper target in an oxygen/argon atmosphere similar to the method used for silver oxide. Oxygen:argon gas flow rates of 2.0 sccm:10.0 sccm were used at a processing pressure of $5 \times 10^{-3}$ mbar. Growth was carried out at an RF power of 100 W RMS for 5 minutes resulting in a brown film of 160 nm thickness (with an estimated RMS surface roughness of ~3.5 nm) which was capped with 30 nm of platinum.

An XPS survey scan taken from the copper oxide film after Ar ion sputter cleaning (4 minutes) gave an atomic O/Cu fraction of 0.316, which is close to stoichiometric value of 0.33 for $Cu_2O$.

The valence band XPS spectrum of the sputter cleaned copper oxide film showed no evidence of the expected band gap of 2.0 eV for $Cu_2O$ but nor did it have the flat 'delocalized' density of states near the Fermi level as observed in the valence band XPS spectrum of the sputter cleaned copper reference sample. The XPS spectrum suggests that the film is likely to contain a high density of degenerate charge carriers and possibly be more metallic than semiconducting in nature.

2. Schottky-Like Diodes

The general procedure for the fabrication of planar Schottky-like diodes consisting of a circular silver oxide Schottky-like contact and a titanium/aluminum/platinum ohmic ring used reactive RF sputtering and lift-off photolithographic techniques.

The following describes the fabrication of planar Schottky-like diodes consisting of a 300 μm diameter, 80 nm thick silver oxide Schottky-like contact with a 25 μm annular separation to a Ti/Al/Pt ohmic ring contact on zinc oxide.

The as-received zinc oxide wafer was ultrasonically pre-cleaned for five minutes in warm acetone (60° C.) then rinsed in methanol, iso-propyl alcohol and dried in nitrogen. The wafer was spin-coated with AZ1518 photoresist and arrays of 300 μm diameter circular contacts—having a contact area of $7.07 \times 10^{-4}$ cm$^2$—were exposed using a chrome coated glass mask and a Karl Suss MA-6 optical mask aligner. The contact patterns were developed using tetramethylammonium hydroxide for 20 seconds followed by a final rinse in deionized water for 60 seconds and drying in nitrogen.

The patterned wafer was immediately loaded into an Edwards Auto 500 sputtering system. The system was pumped down for approximately one hour to a base pressure of $1 \times 10^{-5}$ mbar. A 80 nm thick silver oxide film was deposited by the reactive RF sputtering of a silver target (99.95% purity) using an argon:oxygen plasma at an RF power of 50 W RMS. The target substrate distance was approximately 110 mm and the reactive sputtering was carried out at room temperature.

The argon:oxygen gas flow rates were 10.0 sccm:1.70 sccm, where sccm denotes cubic centimeters per minute at STP. The processing pressure was approximately $4 \times 10^{-3}$ mbar and the deposition rate approximately 120 Å per minute.

A 30 nm thick platinum capping layer was then deposited on top of the silver oxide film by electron beam evaporation carried out in situ at a pressure of $5 \times 10^{-5}$ mbar. Ultrasonically agitated acetone was then used for lift off of the silver oxide/platinum bi-layer.

The ohmic contacts comprised annular titanium/aluminum/platinum (25/75/25 nm) ohmic rings having an inside diameter of about 350 μm and an outside diameter of about 550 μm. These were fabricated around the silver oxide/platinum contacts using conventional lift-off photolithography and electron beam evaporation techniques.

3. Performance Characterization

The performance of the metal oxide Schottky-like contacts on zinc oxide was characterized by room temperature current-voltage (I-V) and capacitance-voltage (C-V) measurements, using a HP4155A parameter analyzer, at room temperature in dark conditions to avoid the effects of any photoconductivity.

The main 'figures of merit' for Schottky-like contact performance are the barrier height ($\Phi_B$) and ideality factor ($\eta$). High quality Schottky contacts should typically have high barrier heights (typically >0.8 eV) and ideality factor as close as possible to unity. These 'figures of merit' can be obtained from I-V measurements using standard thermionic emission theory. In particular, the current across a Schottky diode for V>3 kT/q is given by $$I = I_0 \exp\left[\frac{q(V - IR_s)}{nkT}\right] \quad (1)$$

where η is the ideality factor, k Boltzmann's constant, T the absolute temperature, and $R_s$ the series resistance of the diode. The saturation current $I_o$ of the diode is given by $$I_0 = AA * T^2 \exp\left(-\frac{\Phi_B}{kT}\right) \quad (2)$$

where A is the Schottky contact area, A* the effective Richardson constant (theoretically A*~32 Acm$^{-2}$K$^{-2}$ for zinc oxide), and $\Phi_B$ the barrier height. The barrier height and ideality factor can be obtained by using Equations (1) and (2) to fit the forward bias I-V curves over the range $0.1 < V_f < 0.4$.

(a) Silver Oxide

Planar Schottky-like diodes consisting of a 300 μm diameter, 80 nm thick, silver oxide. Schottky-like contact with a 25 mm annular separation to a Ti/Al/Pt ohmic ring contact were fabricated on the Zn-polar and O-polar faces of the same double sided polished, hydrothermal, c-axis, bulk zinc oxide wafer. The carrier concentration and mobility of this wafer were $3 \times 10^{14}$ cm$^{-3}$ and 200 cm$^2$V$^{-1}$s$^{-1}$ respectively, from single field (0.51 T) Hall effect measurements using the van der Pauw technique. The silver oxide contacts were fabricated using the general procedure described above with oxygen flow rates of 1.25, 1.45, and 1.70 sccm and with the argon flow rate fixed at 10.00 sccm. The resulting silver oxide films had low lateral conductivity and, consequently, a 30 nm platinum capping layer was added by electron beam evaporation.

The $\Phi_B$ versus η plots for the 1.25, 1.45, and 1.70 sccm oxygen silver oxide Schottky-like diodes each fabricated simultaneously on the Zn-polar and O-polar faces showed that the rectifying performance of the different silver oxide films was very similar with no significant compositional effects in the 1.25-1.70 sccm oxygen flow rate range. Most of the silver oxide contacts formed high quality Schottky barriers with ideality factors <1.10. A distinct surface polarity effect was evident, in that diodes fabricated on the Zn-polar face had significantly higher barrier heights than those on the O-polar face, with the best diodes on both faces having similarly low ideality factors.

The I-V characteristics typical of the best '1.70 sccm $O_2$' silver oxide Schottky-like diodes on the Zn-polar and O-polar faces showed rectifying ratios (at ±2V) of more than 9 orders of magnitude. This is probably an underestimate, especially for the Zn-polar face, because the reverse current had reached the noise level, ~50-100 fA, of the HP 4155A parameter analyzer. It was observed that η was independent of bias voltage for significant parts of the forward I-V curve indicating that the silver oxide contacts had very good lateral homogeneity. An observed increase in η at higher forward biases is due to the series resistance of the diodes, while an increase from 0-0.2 V on the Zn-polar face is possibly due to a shunt resistance effect.

Arrays of silver oxide Schottky-like diodes were then fabricated on the polar and non-polar faces of additional hydrothermal and melt bulk zinc oxide wafers. The following bulk zinc oxide wafers were used:

HT-1 double side polished, hydrothermal c-axis wafer, cut to provide Zn-polar and O-polar samples;
HT-2 double sided, polished, hydrothermal m-plane wafer, one face of which was processed;
M-1 melt c-axis wafer, single sided polished on the Zn-polar face;
M-2 melt c-axis wafer, single sided polished on the O-polar face; and
M-3 melt a-plane wafer, single sided polished on the a-plane face.

The electrical characteristics of these wafers, determined from single field (0.51 T) Hall effect measurements, are given in Table 2.

TABLE 2

Electrical characterization, of hydrothermal and melt bulk zinc oxide wafers [carrier concentration (n), mobility (μ), and resistivity (ρ)].

| Wafer | n (cm$^{-3}$) | μ (cm$^2$V$^{-1}$s$^{-1}$) | ρ (Ωcm) |
|---|---|---|---|
| HT-1 c-axis | $1.2 \times 10^{14}$ | 190 | 300 |
| HT-2 m-plane | $2.5 \times 10^{16}$ | 109 | 2.3 |
| M-1 Zn-polar | $1.1 \times 10^{17}$ | 184 | 0.30 |
| M-2 O-polar | $7.4 \times 10^{16}$ | 187 | 0.45 |
| M-3 a-plane | $5.3 \times 10^{16}$ | 187 | 0.63 |

Arrays of planar diodes with 300 μm diameter, 80 nm thick silver oxide Schottky-like contacts (with a 30 nm platinum cap) were fabricated on each of these wafers using the general procedure described above, but with a fixed oxygen flow rate of 1.70 sccm.

Figure 2:
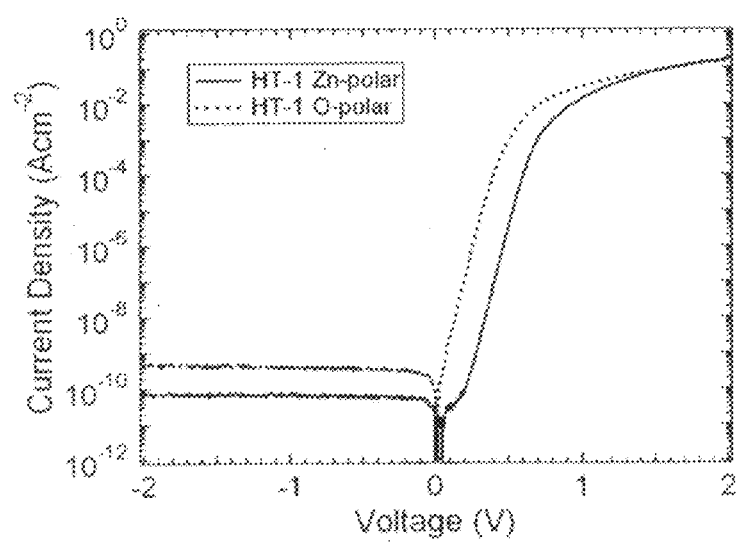
FIG. 2 shows typical room temperature I-V curves for silver oxide Schottky-like contacts on hydrothermally grown, bulk, single crystal zinc oxide wafers.
Figure 3:
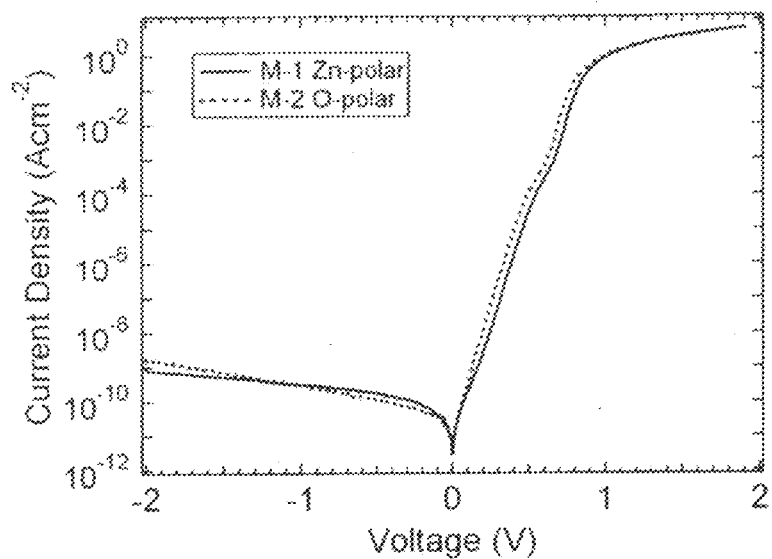
FIG. 3 shows typical room temperature I-V curves for silver oxide Schottky-like contacts on melt grown, bulk, single crystal zinc oxide wafers.

FIGS. 2 and 3 show the I-V characteristics of the silver oxide Schottky-like diodes on the Zn-polar and O-polar faces of hydrothermal and melt c-axis bulk, single crystal zinc oxide wafers at 298 K. These Figures show that the contacts have very high rectifying ratios (greater than 9 orders of magnitude) between the forward and reverse currents. They also show that the reverse 'leakage' currents through the silver oxide contacts are very low (<1 pA at −2 V), which is a further good indicator of diode quality.

These I-V characteristics also show that the silver oxide Schottky-like diodes on the melt zinc oxide wafers have a much lower series resistance, which is expected due to their 2-3 orders of magnitude lower bulk resistivity. The forward bias I-V characteristics of the silver oxide Schottky-like diodes on melt zinc oxide also showed evidence of a slight 'kink' at ~0.65 V which may be due to the influence of more than one barrier—e.g. due to separated silver and silver oxide phases.

Figure 4:
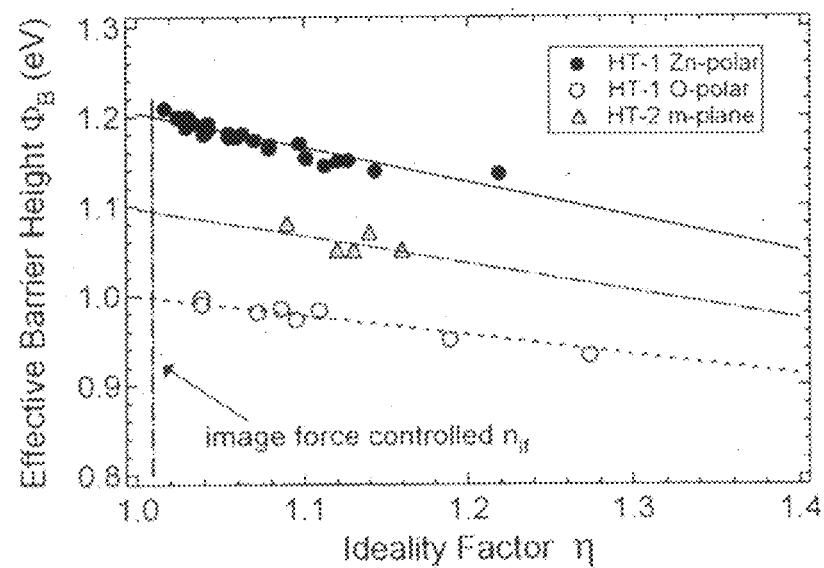
FIG. 4 shows room temperature barrier height ($\Phi_B$) versus ideality factor ($\eta$) plots for silver oxide Schottky-like contacts on hydrothermally grown, bulk, single crystal zinc oxide wafers.
Figure 5:
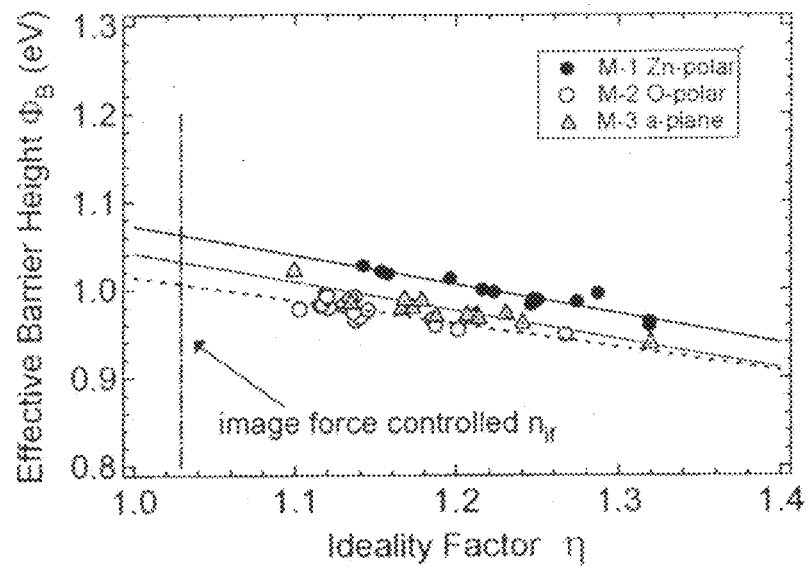
FIG. 5 shows room temperature barrier height ($\Phi_B$) versus ideality factor ($\eta$) plots for silver oxide Schottky-like contacts on melt grown, bulk, single crystal zinc oxide wafers.

FIGS. 4 and 5 show the barrier height ($\Phi_B$) and ideality factor (η), obtained from I-V measurements, for a large number of silver oxide Schottky-like contacts on each of the zinc oxide surfaces at 298 K. These Figures show that the best silver oxide contacts have very large barrier heights (>1.0 eV) and low ideality factors, which are approaching unity. The variations in the 'figures of merit' are believed to be mainly due to variations in the quality and defect concentration across a typical zinc oxide substrate.

The image force controlled ideality factors, $\eta_{if}$, for the hydrothermal and melt ZnO wafers are included in FIGS. 4 and 5. These factors are a theoretical estimation of the best ideality factor that can be achieved by real Schottky-like contacts and were calculated using the expressions published in the literature (see R. T. Tung, *Phys. Rev. Len.* 84 6078 (2000))

$$\frac{1}{n_{if}} = 1 - \frac{\delta\Phi_{if}}{4}\left(\Phi_B - V - \xi - \frac{kT}{q}\right)^{-1} \quad (3)$$

where V is the applied bias, which is set to zero, $\xi=kT\ln(N_C/n)$ is the energy difference between the Fermi level of the zinc oxide material and the bottom of the conduction band ($N_C$ is the effective density of states in the conduction band=$2.94 \times 10^{18}$ cm$^{-3}$ for zinc oxide) and $\delta\Phi_{if}$ is the image force lowering correction given by $$\delta\Phi_{if} = \left[\left(\frac{q^3 N_D}{8\pi^2 \varepsilon_\infty^2 \varepsilon_s \varepsilon_0^3}\right)\left(\Phi_B - V - \xi - \frac{kT}{q}\right)\right]^{\frac{1}{4}} \quad (4)$$

where $N_D$ is the effective doping density, $\varepsilon_\infty$ the optical dielectric constant (4.5) and $\varepsilon_s$ is the electrical dielectric constant (8.5) for zinc oxide and of the other symbols have their usual scientific meaning.

Significant, ZnO material-related, differences can be seen in the $\Phi_B$ versus η plots on hydrothermal and melt bulk ZnO, especially for the Zn-polar and non-polar faces. FIG. 4 confirms the previously observed polarity effect for hydrothermal ZnO with silver oxide. Schottky-like diodes on the Zn-polar face having significantly higher barriers (by ~200 meV) than those on the O-polar face. The Schottky-like diodes on the non-polar, m-plane face had intermediate barrier heights, in between those on the two polar faces. A much smaller polarity effect was evident for the Schottky-like diodes on melt zinc oxide with a barrier height difference of ~50 meV between the Zn-polar and O-polar faces, with those on the non-polar, a-plane face again having intermediate barrier heights.

For each of the $\Phi_B$ versus η plots, there is a linear trend with $\Phi_B$ decreasing with increasing η. This is the expected decrease in $\Phi_B$ due to increasing lateral inhomogeneity of the contacts, caused by structural variations in the substrate and/or variations in surface contamination. These linear trends can be extrapolated to the image force limited ideality factor, $\eta_{if}$, to determine the image force controlled barrier height, $\Phi_B^{if}$, which can in turn be used to obtain the image force corrected, homogeneous barrier height $\Phi_B^{hom*}=\Phi_B^{if}+\delta\Phi_{if}$ where $\delta\Phi_{if}$ is the image force lowering correction.

The image force corrected, homogeneous barrier height, $\Phi_B^{hom*}$, is a useful parameter because it gives the barrier height of a certain type of Schottky-like contact to a given semiconductor, corrected for any kind of non-ideal behavior. It is, therefore, the best barrier height parameter to compare to theoretical models (see W. Monch, *J. Vac. Sci. Technol. B* 17 1867 (1999)). For the silver oxide Schottky-like contacts disclosed herein, the extrapolation to the image force controlled ideality factor, $\eta_{if}$ is only over a very short 'distance', due to their high quality.

Table 3 gives the values of $\eta_{if}$, $\Phi_B^{if}$ and $\Phi_B^{hom*}$ for each of the ZnO faces. The image force correction for the diodes on hydrothermal ZnO is relatively small (~0.02 eV) due to its low carrier concentration. However, the correction for melt ZnO (~0.08 eV) increases the size of the $\Phi_B^{hom*}$ by almost 10%. The values of $\Phi_B^{hom*}$ for the different faces of melt ZnO now lie in between the values for the polar faces of hydrothermal ZnO. Image force lowering also affects the reverse bias I-V characteristics by introducing a voltage dependence in the reverse current. FIGS. 4 and 5 show that this dependence is much larger for the Schottky-like diodes on melt ZnO, consistent with the greater influence of image force lowering.

TABLE 3

Image force corrections to the effective barrier heights on the polar and non-polar faces of hydrothermal and melt bulk zinc oxide [image force controlled ideality factor ($\eta_{if}$), image force controlled barrier height ($\Phi_B^{if}$), image force lowering correction ($\delta\Phi_{if}$), image force corrected homogeneous barrier height ($\Phi_B^{hom*}$), tunneling parameter $E_{00}/kT$, and ideality factor due to thermionic field emission, $\eta_{TFE}$].

| Best Diode | $\eta_{if}$ | $\Phi_B^{if}$ (eV) | $\delta\Phi_{if}$ (eV) | $\Phi_B^{hom*}$ (eV) | $E_{00}/kT$ (at 300 K) | $\eta_{TFE}$ |
|---|---|---|---|---|---|---|
| HT-1 Zn-polar | 1.03 | 1.20 | 0.02 | 1.22 | 0.005 | 1.000 |
| HT-1 O-polar | 1.03 | 1.00 | 0.02 | 1.02 | 0.005 | 1.000 |
| HT-2 m-plane | — | 1.09 | — | — | — | — |
| M-1 Zn-polar | 1.03 | 1.07 | 0.08 | 1.15 | 0.16 | 1.008 |
| M-2 O-polar | 0.10 | 1.01 | 0.08 | 1.09 | 0.13 | 1.006 |
| M-3 a-plane | 0.10 | 1.04 | 0.08 | 1.12 | 0.11 | 1.004 |

FIGS. 2 to 5 also shows that the ideality factors of the best silver oxide diodes on hydrothermal ZnO, especially on the polar faces, are very close to the image force controlled limit, while the best diodes on melt ZnO have ideality factors which are still significantly larger than $\eta_{if}$. It is apparent that some other form of non-ideal behavior, in addition to image force lowering, is taking place in the melt ZnO diodes. A possible candidate is thermionic field emission (TFE). Table 3 also gives the tunneling parameter, $E_{00}$, and $\eta_{TFE}$, the ideality factor due to TFE, for each of the ZnO faces calculated using the expressions published in the literature (B. Abay et al., *Semicond. Sci. Technol.* 18 75 (2003)). TFE is negligible for hydrothermal ZnO since $E_{00}/kT \ll 1$. TFE is more significant for melt ZnO due to its higher carrier concentration, but still is only expected to cause a modest increase in ideality factor. However the presence of traps, such as those generated by point defects, in the depletion region can significantly increase the tunneling probability and, consequently, the ideality factor because carriers can first tunnel into these traps and then through the barrier.

The barrier heights of the silver oxide Schottky-like contacts shown in FIGS. 2 to 5 were confirmed from room temperature capacitance-voltage (C-V) measurements using a Philips PM6304 RCL meter at measuring frequencies in the range 2.5 kHz-100 kHz. The same dark conditions were used. The barrier heights obtained from these C-V measurements agreed very closely with those obtained from I-V measurements. This agreement is another good indication of the lateral homogeneity of the silver oxide contacts.

The barrier height is determined from C-V measurements by first finding the 'built in' potential $V_{bi}$ from a plot of $1/C^2$ versus V using $$\frac{A^2}{C^2} = \left(\frac{2}{\varepsilon\varepsilon_0 N_D}\right)\left(V_{bi} - \frac{kT}{q} - V\right) \quad (5)$$

where $\varepsilon$ is the static dielectric constant=8.5 for zinc oxide, $\varepsilon_0$ the vacuum permittivity, and $N_D$ the effective donor concentration. The barrier height ($\Phi_B$) is then obtained from $$\Phi_B = qV_{bi} + \xi \quad (6)$$

where $\xi = kT\ln(N_C/n)$ is the energy difference between the Fermi level of the zinc oxide material and the bottom of the conduction band, and where $N_C$ is the effective density of states in the conduction band=$2.94\times10^{18}$ cm$^{-3}$ for zinc oxide, and n is the carrier concentration of the zinc oxide material.

Figure 6:
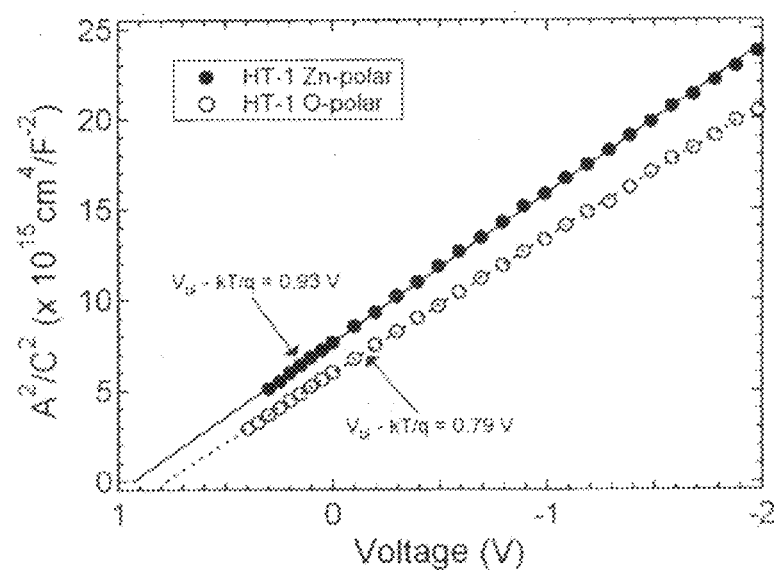
FIG. 6 shows typical room temperature C-V characteristics of silver oxide Schottky-like contacts on hydrothermally grown, bulk, single crystal zinc oxide wafers.
Figure 7:
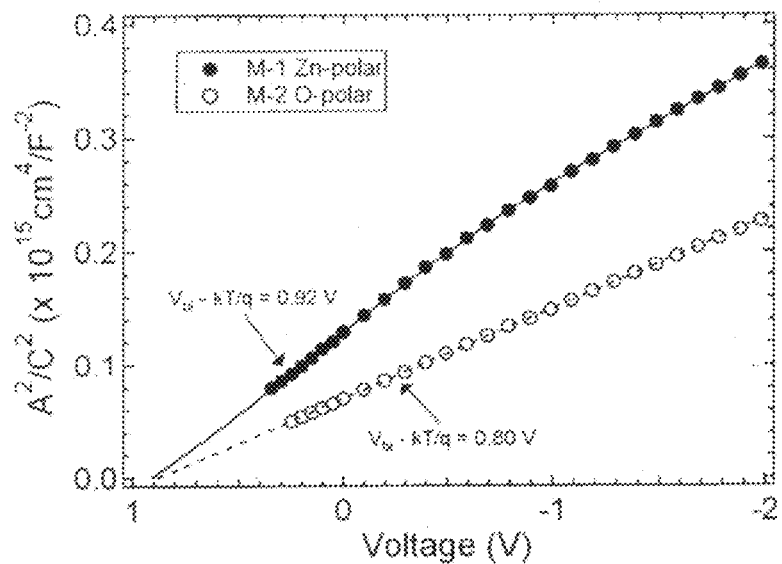
FIG. 7 shows typical room temperature C-V characteristics of silver oxide Schottky-like contacts on melt grown, bulk, single crystal zinc oxide wafers.

Typical C-V characteristics of the silver oxide Schottky-like diodes on the hydrothermal and melt c-axis wafers at 298 K and a frequency of 20 kHz are shown in FIGS. 6 and 7. These are consistent with the polarity effects observed in the I-V characteristics, in that there is a clear difference in the built-in voltage, $V_{bi}$, for Schottky-like diodes on the Zn-polar and O-polar faces of hydrothermal zinc oxide and a much smaller difference between diodes on the polar faces of melt zinc oxide. The I-V and C-V characteristics of the best silver oxide Schottky-like diodes on hydrothermal and melt zinc oxide are summarized in Table 4. Good agreement was obtained between the barrier heights determined by I-V and C-V characterization, which is an indication of the good lateral homogeneity of the silver oxide Schottky-like diodes.

TABLE 4

Electrical characteristics of the best silver oxide Schottky-like diodes on hydrothermal and melt, bulk ZnO wafers from room temperature I-V and C-V measurements [ideality factor ($\eta$) and barrier height ($\Phi_{B,IV}$) from IV measurements; built-in potential ($V_{bi,CV}$), barrier height ($\Phi_{B,CV}$) and effective donor density ($N_{D,CV}$) from CV measurements].

| Best Diode | $\eta$ | $\Phi_{B,I-V}$ (eV) | $V_{bi,C-V}$ (V) | $\Phi_{B,C-V}$ (eV) | $N_{D,C-V}$ (cm$^{-3}$) |
|---|---|---|---|---|---|
| HT-1 Zn-polar | 1.03 | 1.20 | 0.93 | 1.19 | $2.0 \times 10^{15}$ |
| HT-1 O-polar | 1.04 | 0.99 | 0.78 | 1.04 | $2.3 \times 10^{15}$ |
| HT-2 m-plane | 1.09 | 1.08 | — | — | — |
| M-1 Zn-polar | 1.14 | 1.03 | 0.94 | 1.02 | $1.5 \times 10^{17}$ |
| M-2 O-polar | 1.10 | 0.98 | 0.89 | 0.99 | $2.1 \times 10^{17}$ |
| M-3 a-plane | 1.10 | 1.02 | — | — | — |

Breakdown Voltage

The breakdown voltages of silver oxide Schottky-like diodes on the Zn-polar face of hydrothermal zinc oxide were determined from their extended reverse bias I-V characteristics. The breakdown voltages were typically in the range of −40 V to −60 V. Similar values were also obtained for vertical geometry silver oxide Schottky-like diodes on the Zn-polar face of hydrothermal zinc oxide (discussed below).

Temperature Dependent Behavior of Silver Oxide Diodes

Silver oxide Schottky-like diodes fabricated on the Zn-polar face of a hydrothermal, c-axis, zinc oxide wafer were used for these investigations.

Figure 8:
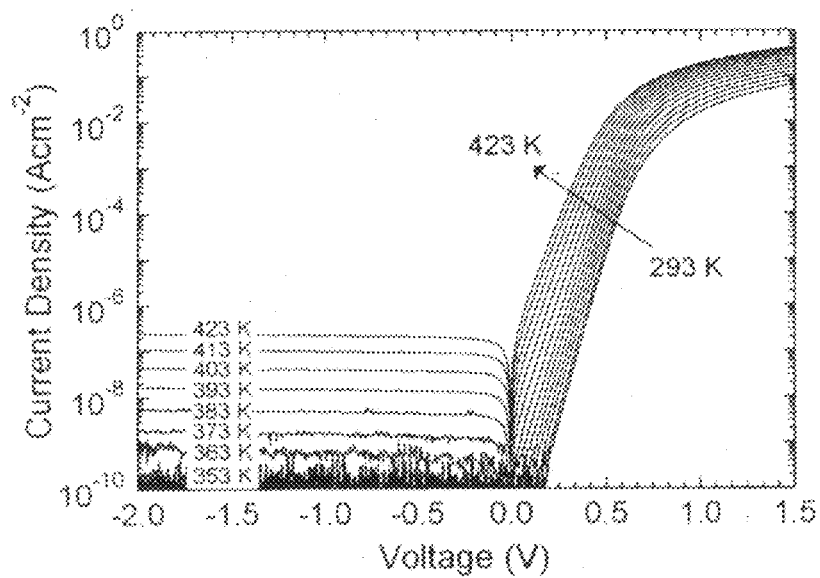
FIG. 8 shows the above room temperature I-V curves for a silver oxide Schottky-like diode on a hydrothermally grown bulk, single crystal zinc oxide wafer.
Figure 9:
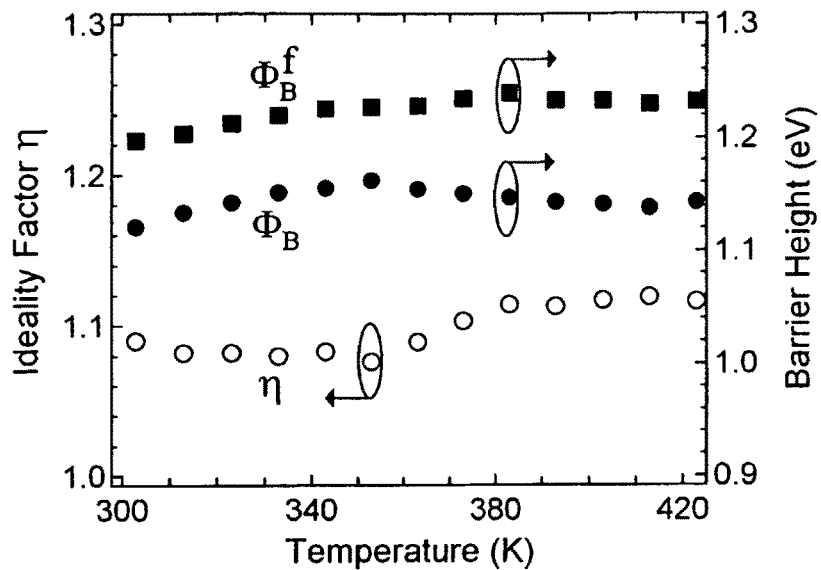
FIG. 9 shows the variation of ideality factor ($\eta$), effective barrier height ($\Phi_B$), and flat band barrier height ($\Phi_B^f$) with temperature for a planar silver oxide Schottky-like contact on a hydrothermally bulk, single crystal zinc oxide wafer.

FIG. 8 shows the above room temperature I-V-T characteristics measured, on a silver oxide Schottky-like diode exposed to atmosphere, from 294-423 K at intervals of 10 K. The device temperature was controlled to an accuracy of 0.5% using an Arico P200 temperature controller. The forward bias characteristics show exponential behavior over many orders of magnitude of current indicating the dominance of thermionic emission. $\Phi_B$ and $\eta$ were determined for each temperature and the results are shown in FIG. 9. $\Phi_B$ and $\eta$ vary over a relatively small range, in a 'mirror-like' fashion, about mean values of 1.14 eV and 1.10 respectively.

Figure 10:
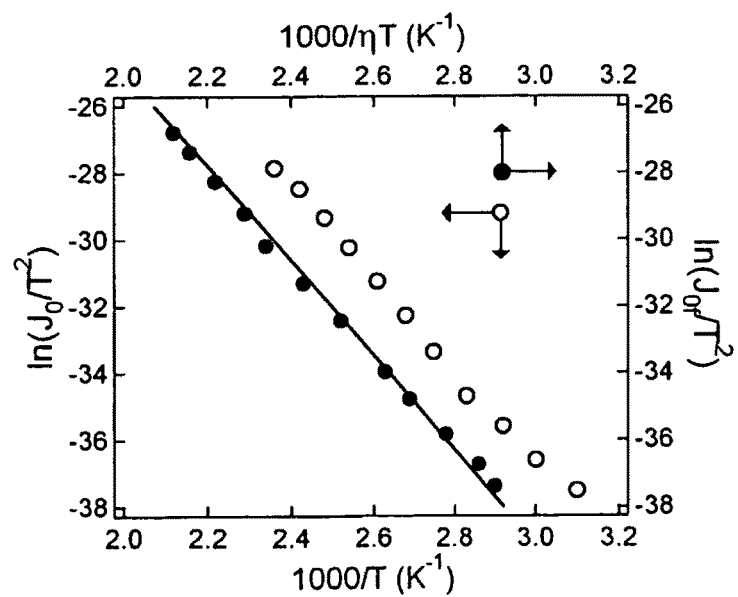
FIG. 10 shows a Richardson plot and a modified Richardson plot for a planar silver oxide Schottky-like diode on a hydrothermally grown bulk, single crystal zinc oxide wafer.

FIG. 10 shows a Richardson plot of $\ln(J_0/T^2)$ vs $1000/T$ (open circles) where $J_0$ is the saturation current density, obtained by extrapolating the forward bias I-V characteristics of FIG. 8 to zero bias. $J_0$ is related to the effective barrier height $\Phi_B$ and the Richardson constant A* by $$J_0 = A^*T^2\exp\left(\frac{-q\Phi_B}{kT}\right) \quad (7)$$

Therefore, $\Phi_B$ can also be determined from the slope of the Richardson plot while A* can be obtained from the intercept. However, the temperature dependence of $\Phi_B$ makes fitting a single line to the Richardson plot (open circles of FIG. 10) problematic.

This is often addressed by using the flat band barrier height, $\Phi_B^f$, which is considered to be a fundamental quantity that eliminates the influence of most causes of non-ideal behavior $$\Phi_B^f = \eta\Phi_B - (\eta-1)\xi \quad (8)$$

where $\xi = (kT/q)\ln(N_C/n)$ is energy difference between the Fermi level and the bottom of the conduction band. $N_C$ is the conduction band density of states ($2.94 \times 10^{18}$ cm$^{-3}$ for ZnO) and n is the carrier concentration. Substituting $\Phi_B^f$ for $\Phi_B$ in Equation 7 gives $$J_{0f} = A^*T^2\exp\left(\frac{-q\Phi_B^f}{\eta kT}\right) \quad (9)$$

where $J_{0f}$ is the flat band saturation current density given by $$J_{0f} = J_0\exp\left[\left(\frac{\eta-1}{\eta}\right)\ln\left(\frac{N_C}{n}\right)\right] \quad (10)$$

FIG. 9 shows the values of $\Phi_B^f$ calculated from the $\Phi_B$ and $\eta$ values (shown in the same Figure) using Equation (8). As expected, $\Phi_B^f$ has a smaller temperature dependence than $\Phi_B$ particularly above 340 K. Equation (10) was used to plot a modified Richardson plot of $\ln(J_0/T^2)$ vs $1000/\eta T$ (solid circles). A linear least squares fit was applied to this modified plot using Equation (9), the theoretical value of 32 Acm$^{-2}$K$^{-2}$ for A*, and $\Phi_B^f$ as the adjustable parameter. The value of $\Phi_B^f$ obtained from the slope of the linear fit was 1.23 eV which is in good agreement with the values shown in FIG. 9 and identical to the value for the image force corrected, homogeneous barrier height, $\Phi_B^{hom*}$, in Table 3. This shows agreement between two separate parameters, $\Phi_B^f$ and $\Phi_B^{hom*}$, which attempt to eliminate the effects of non-ideal behavior. It also shows that the experimental data is consistent with the theoretical value of A*.

Reverse Leakage Current

At higher temperatures, the reverse leakage characteristics of the silver oxide Schottky-like diodes can be more accurately measured as the current rises above the ~50-100 fA noise level of the HP 4155A parameter analyzer (see FIG. 8). These reverse current characteristics can then be compared to theoretical models for thermionic emission and thermionic field emission to assess the dominant transport mechanism.

For pure thermionic emission (TE), the sole cause of voltage dependency in the reverse current is from the image force lowering of the Schottky barrier. This is known as the 'TE+barrier lowering' model, with the reverse current density, $J_R^{if}$, is given by $$J_R^{if} = A^*T^2\exp-\frac{q}{kT}\left[\Phi_B - \left(\frac{qE}{4\pi\varepsilon_s\varepsilon_0}\right)^{\frac{1}{2}}\right] \quad (11)$$

where E is the maximum electric field at the Schottky contact interface $$E = \left[\frac{2qN_D}{\varepsilon_s\varepsilon_0}\left(V_R + \Phi_B - \xi - \frac{kT}{q}\right)\right]^{\frac{1}{2}} \quad (12)$$

and where $N_D$ is the effective donor density, $\varepsilon_s$ is the electrical dielectric constant of zinc oxide, $V_R$ is the reverse bias, and all of the other symbols have their usual meaning.

For thermionic field emission (TFE), Hatakeyama et al. (*Mater. Sci. Forum* 389, 1169 (2002)) derived a 'compact' expression for the reverse current density expected from the original analysis of Padovani and Stratton (*Solid-State Electron.* 9, 695 (1966))

$$J_R^{TFE} = \frac{A^*TqhE}{2\pi kT}\left(\frac{\pi}{2m^*kT}\right)^{\frac{1}{2}}\exp\left[-\frac{q}{kT}\left(\Phi_B - \frac{qh^2E^2}{24m^*(2\pi kT)^2}\right)\right] \quad (13)$$

where m* is the effective electron mass ($=0.27 \, m_e$) and the other quantities have their usual meaning.

Figure 11:
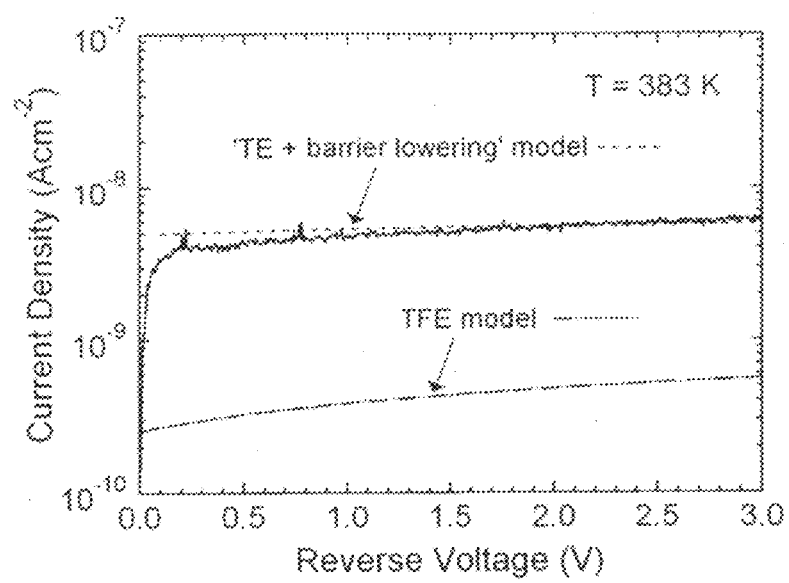
FIG. 11 shows the reverse leakage current of a planar silver oxide Schottky-like diode on a hydrothermally grown bulk, single crystal zinc oxide wafer against the predictions of various models.
Figure 12:
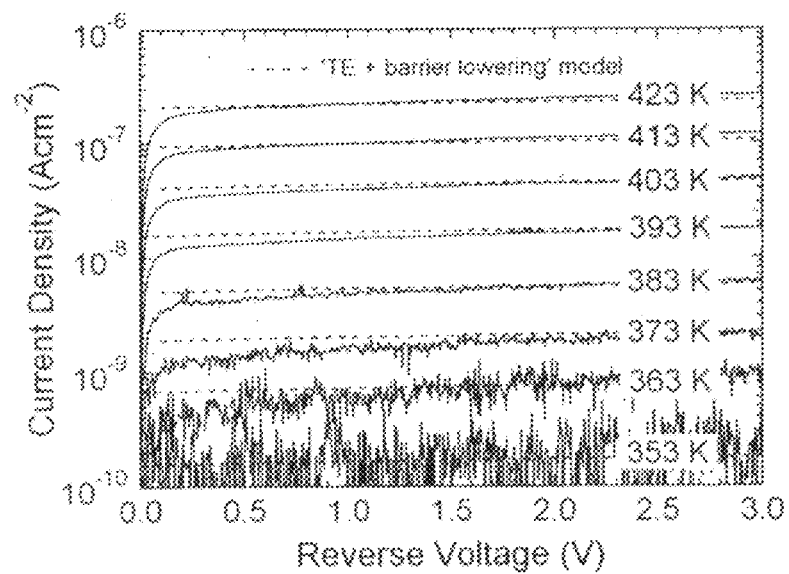
FIG. 12 shows the measured reverse leakage currents of a silver oxide Schottky-like diode on a hydrothermally grown bulk, single crystal zinc oxide wafer against model predictions at various temperatures.

FIG. 11 shows the reverse leakage current measured at 383 K compared to the predictions of the 'TE+barrier lowering' and TFE models. This shows that the reverse current is a close match to the 'TE+barrier lowering' model with the TFE current being relatively insignificant. FIG. 12 is a comparison of the reverse bias I-V characteristics and the 'TE+barrier lowering' model at temperatures from 353-423 K, which are all in excellent agreement. It is, therefore, reasonable to conclude that the transport process through the silver oxide Schottky-like contacts, in air, at room temperature and above is dominated by pure thermionic emission. This is another indication of the 'ideal' thermionic nature of the current transport through the silver oxide Schottky-like contacts.

Comparison of Planar and Vertical Silver Oxide Diodes

The silver oxide Schottky-like diodes discussed above have planar geometry type with the Schottky-like and ohmic contacts fabricated on the same crystal face.

Vertical geometry silver oxide Schottky-like diodes were fabricated on c-axis and m-plane hydrothermal bulk ZnO wafers (10 mm×10 mm×500 μm). The Schottky-like contacts consisted of arrays of 300 μm diameter, 80 nm thick, silver oxide layers fabricated with an oxygen flow rate of 1.70 sccm and capped with a 30 nm thick platinum film. The ohmic contact consisted of a large area, typically 4 mm×4 mm Ti/Al/Pt (40/100/30 nm) layer deposited by electron beam evaporation on the opposite face of the wafer.

There appeared to be very little difference in the I-V characteristics of planar versus vertical geometry silver oxide Schottky-like diodes with both diode geometries giving high barrier heights and very low ideality factors close to the image force controlled limit. The $\Phi_B$ versus $\eta$ plots determined from the I-V characteristics of multiple, vertical geometry silver oxide diodes on the Zn-polar, O-polar, and m-plane faces of hydrothermal bulk zinc oxide wafers were linearly fitted to determine the image force corrected homogeneous barrier height, $\Phi_B^{hom*}$. This gave values for $\Phi_B^{hom*}$ of 1.20 and 1.00 for the Zn-polar and O-polar faces respectively, compared to the values of 1.22 and 1.02 for planar silver oxide Schottky-like diodes of the same composition. The $\Phi_B$ versus $\eta$ plots for the planar and vertical geometry Schottky-like diodes were very similar with the barrier heights of the vertical diodes being slightly (~20 meV) lower. This small effect may be due to the differences in the effective area of the oxide Schottky-like contact for the two different geometries with the effective area likely to be slightly larger for the vertical geometry diodes due to larger area of the ohmic contact.

TABLE 5

Built in voltage, $V_{bi}$, and barrier height $\Phi_{B,C\text{-}V}$ determined from the typical C-V characteristics of planar and vertical geometry silver oxide Schottky-like diodes on hydrothermal ZnO. The barrier heights, $\Phi_{B,I\text{-}V}$, of the same diodes determined from their I-V characteristics are shown for comparison.

| Diode Geometry | Polarity | $V_{bi,C\text{-}V}$ (eV) | $\Phi_{B,C\text{-}V}$ (eV) | $\Phi_{B,I\text{-}V}$ (eV) |
|---|---|---|---|---|
| Planar | Zn-polar | 0.93 | 1.19 | 1.20 |
| Planar | O-polar | 0.78 | 1.04 | 1.00 |
| Planar | m-plane | 0.80 | 1.06 | 1.09 |
| Vertical | Zn-polar | 0.72 | 0.96 | 1.18 |
| Vertical | O-polar | 0.54 | 0.80 | 0.98 |
| Vertical | m-plane | 0.78 | 1.04 | 1.09 |

In contrast to the I-V characteristics, a significant geometry-related effect was observed for C-V measurements. The built-in voltages, $V_{bi}$, obtained from the extrapolation of the corresponding linear fits of the C-V characteristics of planar and vertical geometry silver oxide Schottky-like diodes on the different crystal faces of hydrothermal ZnO to $1/C^2=0$ are given in Table 5. Vertical geometry diodes with the silver oxide Schottky-like contact on the Zn-polar and O-polar faces have 0.21-0.24 eV lower values of $V_{bi}$ compared to planar geometry diodes. The values of $\Phi_{B,C\text{-}V}$ determined from $\Phi_{B,C\text{-}V}=V_{bi}+\xi$, are also shown in Table 5 together with the values of $\Phi_{B,I\text{-}V}$ from the I-V characteristics of the same diodes. While the values of $\Phi_{B,C\text{-}V}$ and $\Phi_{B,I\text{-}V}$ are similar for planar geometry diodes, there is a deficit of 0.20±0.02 eV in the values of $\Phi_{B,C\text{-}V}$ for the vertical geometry diodes. This deficit is thought to be due to the large spontaneous polarization of ZnO which creates a permanent electric dipole in the vertical c-axis direction which affects the C-V measurements for vertical geometry diodes. In the case of the non-polar m-plane face, there appears to be no 'geometry effect' with the values of $\Phi_{B,C\text{-}V}$ and $\Phi_{B,I\text{-}V}$ almost the same for both planar and vertical geometry diodes. This is expected because spontaneous polarization effects only occur in the c-axis direction and are not expected to affect the m-plane face.

(b) Iridium Oxide

Separate arrays of vertical geometry Schottky-like diodes with 300 μm diameter '50 mTorr $O_2$' and '100 mTorr $O_2$' iridium oxide Schottky-like contacts were fabricated on two hydrothermal c-axis ZnO wafers using pulsed laser deposition and lift-off photolithographic techniques.

Figure 13:
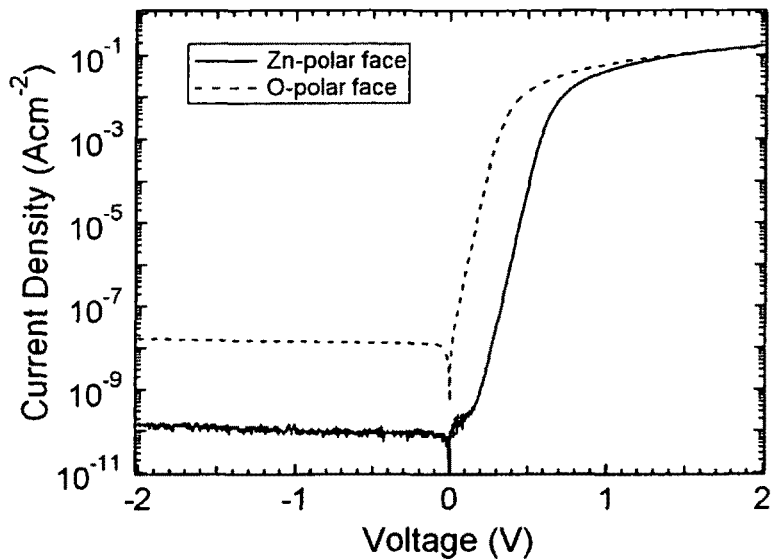
FIG. 13 shows typical room temperature I-V curves for iridium oxide Schottky-like contacts formed on hydrothermally grown, bulk, single crystal zinc oxide wafers under an ambient oxygen pressure of 50 mTorr.
Figure 14:
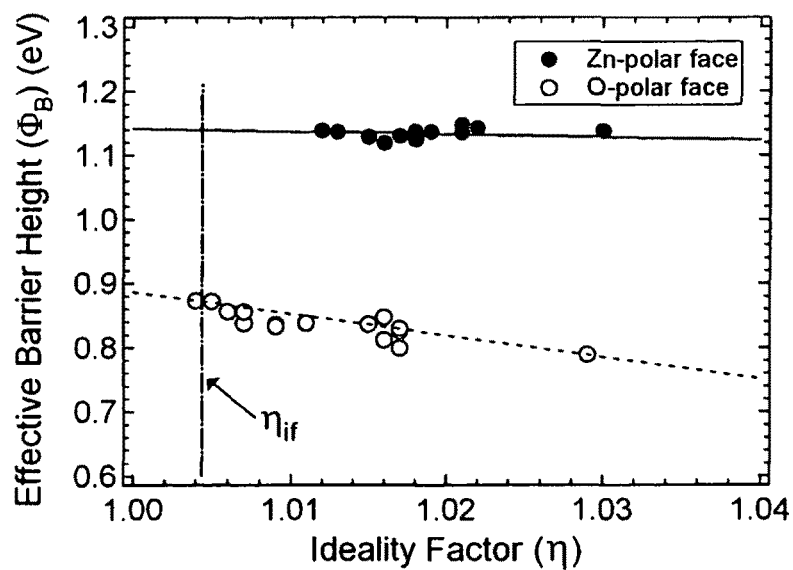
FIG. 14 shows room temperature barrier height ($\Phi_B$) versus ideality factor ($\eta$) plots for iridium oxide Schottky-like contacts formed on hydrothermally grown, bulk, single crystal zinc oxide wafers under an ambient oxygen pressure of 50 mTorr.

FIG. 13 shows typical I-V characteristics, and FIG. 14 $\Phi_B$ versus η plots, at 298 K for '50 mTorr $O_2$' iridium oxide diodes on the Zn-polar and O-polar faces of the same hydrothermal wafer. The image force controlled ideality factor, $\eta_{if}$, for the hydrothermal zinc oxide wafer is also shown in FIG. 14.

These arrays produced a high yield (>90%) of very low ideality factor Schottky-like contacts on both polar faces. A dramatic surface polarity related effect was observed in that the barrier heights of the Schottky-like diodes on the Zn-polar face were typically 250 meV higher than those on the O-polar face. The ideality factors on both polar faces were very close to the image force controlled limit, $\eta_{if}$, indicating that the polarity difference was not due to differences in the homogeneity of the contacts. The image force corrected homogeneous barrier heights, $\Phi_B^{hom*}$, for the '50 mTorr $O_2$' iridium oxide diodes on the Zn-polar and O-polar faces were found to be 1.16 eV and 0.91 eV, using the method described earlier.

Figure 15:
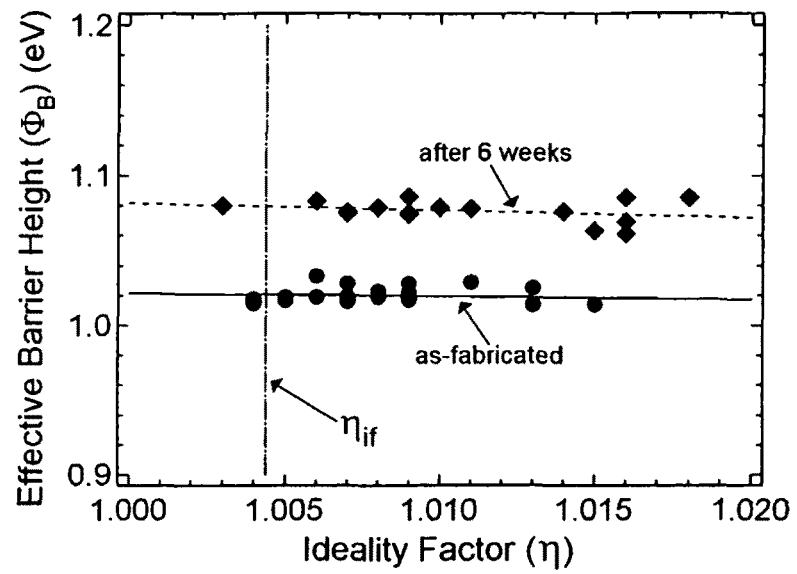
FIG. 15 shows room temperature barrier height ($\Phi_B$) versus ideality factor ($\eta$) plots for iridium oxide Schottky-like contacts formed on hydrothermally grown, bulk, single crystal zinc oxide wafers under an, ambient oxygen pressure of 100 mTorr.

FIG. 15 shows a $\Phi_B$ versus η plot at 298 K for the '100 mTorr $O_2$' iridium oxide Schottky-like contacts on the Zn-polar face of an additional hydrothermal wafer. The image force controlled ideality factor, $\eta_{if}$, for the hydrothermal zinc oxide wafer is also shown in FIG. 15. After fabrication, the Schottky-like contacts had very low ideality factors, which were close to the image force controlled ideality factor, $\eta_{if}$. However, the barrier heights of these Schottky-like contacts were significantly less than those of the '50 mTorr $O_2$' iridium oxide contacts on the same polar face. The $\Phi_B^{hom*}$ for the as-fabricated '100 mTorr $O_2$' iridium oxide Schottky-like contacts in FIG. 15 is 1.05 eV compared to 1.16 eV for the '50 mTorr $O_2$' contacts.

This difference is probably a consequence of the lower O/Ir fraction of the '100 mTorr $O_2$' iridium oxide Schottky-like contacts which, from electronegativity arguments, may result in a lower work function compared to the more oxygen rich '50 mTorr $O_2$' contacts. The high ideality of both these Schottky-like contacts indicates the formation of a very homogeneous Schottky barrier and consequently the lower barrier height can only be a result of a lower work function or, alternatively, a decreased electric dipole contribution from Ir—O chemical bonding at the Schottky interface.

The I-V characteristics of the '100 mTorr $O_2$' iridium oxide Schottky-like contacts were re-measured after 6 weeks storage at room temperature. The 're-measured' $\Phi_B$ versus η plot (FIG. 15) shows an age related, barrier height increase of ~60 meV and a corresponding increase in $\Phi_B^{hom*}$ to 1.11 eV. The I-V characteristics were re-measured again after a further 10 week storage and, while most of the iridium oxide Schottky-like contacts showed no further change, the barrier height of a few contacts had increased again by another 30-40 meV, bringing them close to the barrier height of the '50 mTorr $O_2$' contacts. This increase in barrier height for almost ideal contacts must be due to either (a) further oxidation of the film resulting in an increased O/Ir fraction and an increased work function or (b) an increase in chemical bonding, involving Ir—O bonds, at the Schottky interface.

Breakdown voltages in excess of −100 V were achieved for the iridium oxide Schottky-like diodes described herein.

(c) Platinum Oxide

Arrays of vertical geometry Schottky-like diodes with 300 μm diameter, 240 nm thick, '100 mTorr $O_2$' platinum oxide Schottky-like contacts were fabricated on the Zn-polar and O-polar faces of the same hydrothermal, c-axis, bulk ZnO wafer using pulsed laser deposition and lift-off photolithographic techniques. The platinum oxide film had poor lateral conductivity and an ~30 nm thick Pt capping layer was added to improve the current flow through the contacts.

Figure 16:
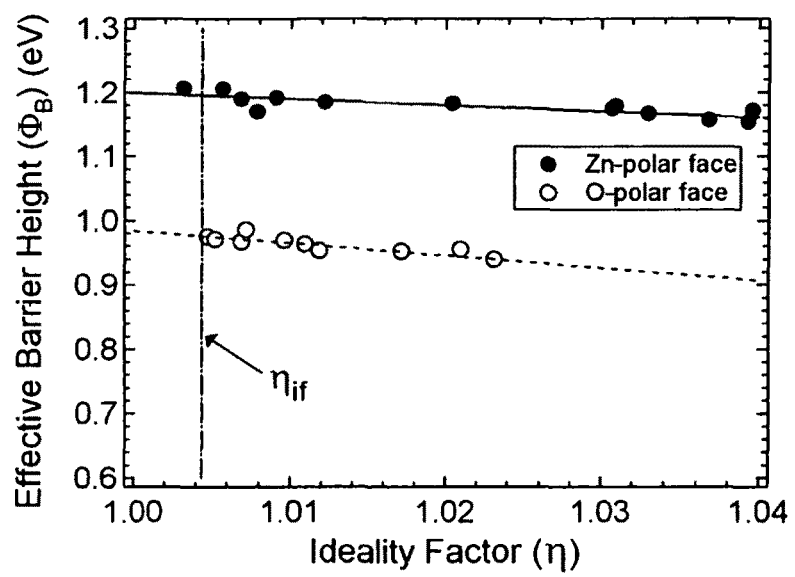
FIG. 16 shows room temperature barrier height ($\Phi_B$) versus ideality factor ($\eta$) plots for platinum oxide Schottky-like contacts on a hydrothermally grown, bulk, single crystal zinc oxide wafer.

FIG. 16 shows $\Phi_b$ versus η plots, including the image force, controlled ideality factor, $\eta_{if}$, for the hydrothermal zinc oxide wafer, at 296 K for the platinum oxide Schottky-like contacts on each polar face taken 4 weeks after fabrication. During that time the barrier heights of the contacts on the Zn-polar face had increased by ~60 meV. The barrier heights of the '100 mTorr $O_2$' platinum oxide contacts on the Zn-polar and O-polar face of hydrothermal ZnO were remarkably similar to those for previously observed for silver oxide Schottky-like contacts on the same material. The $\Phi_B^{hom*}$ values for the platinum oxide Schottky-like contacts on the Zn-polar and O-polar faces were 1.23 eV and 1.01 eV respectively, from FIG. 16, compared to 1.21 eV and 1.01 eV for vertical geometry silver oxide contacts on similar hydrothermal ZnO material.

Figure 17:
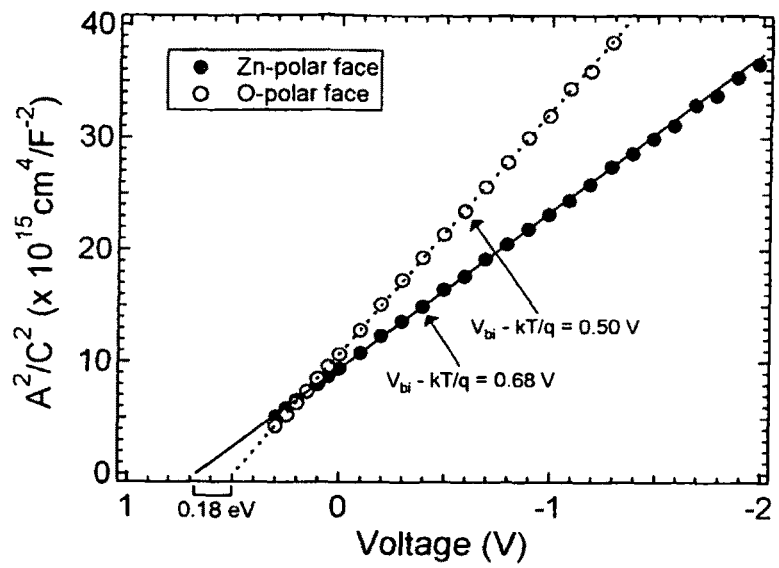
FIG. 17 shows typical room temperature C-V characteristics of platinum oxide Schottky-like contacts on a hydrothermally grown, bulk, single crystal zinc oxide wafer.

FIG. 17 shows C-V characteristics of typical '100 mTorr O$_2$' platinum oxide Schottky-like contacts at 298 K and a frequency of 10 kHz. These show a polarity difference of 0.18 eV in the built-in voltage, similar to the 0.22 eV difference in $\Phi_B^{hom*}$ from the I-V characteristics in FIG. 16. However, the values of the $\Phi_{B,CV}$, determined from $\Phi_{B,CV}=V_{bi}+\xi$, were only 1.03 eV and 0.80 eV for the Zn-polar and O-polar faces respectively, a deficit of approximately 0.20 eV for vertical geometry diodes.

(d) Copper Oxide

Arrays of vertical geometry Schottky-like diodes with 300 μm diameter, 100 nm thick, copper oxide Schottky-like contacts were fabricated on the Zn-polar face of a hydrothermal ZnO wafer using reactive RF sputtering and lift-off photolithographic techniques. A 30 nm thick Pt capping layer was added to improve current flow through the contacts. For comparison, a separate array of plain copper contacts was fabricated along side the copper oxide contacts.

Figure 18:
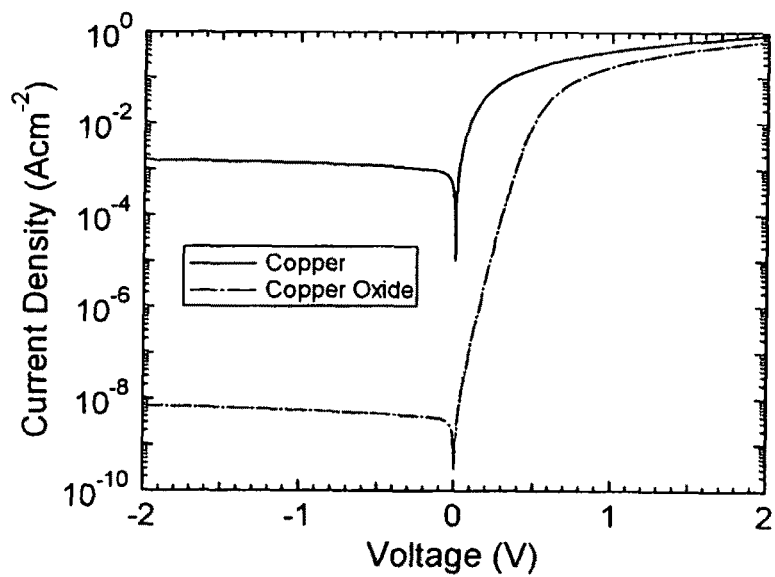
FIG. 18 shows typical room temperature I-V curves for copper oxide and copper Schottky-like contacts on a hydrothermally grown, bulk, single crystal zinc oxide wafer.
Figure 19:
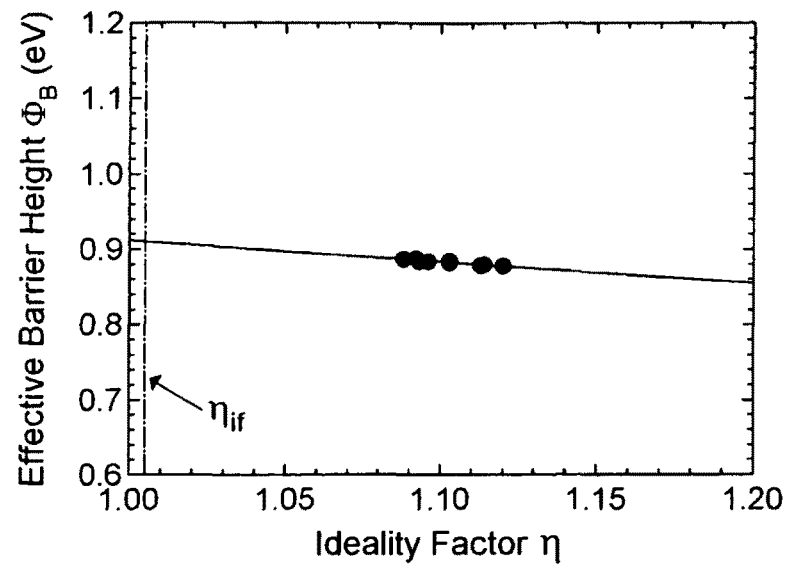
FIG. 19 shows room temperature barrier height ($\Phi_B$) versus ideality factor ($\eta$) plots for copper oxide Schottky-like contacts on hydrothermally grown, bulk, single crystal zinc oxide wafers.

FIG. 18 shows the typical I-V characteristics of the copper and copper oxide Schottky-like contacts at 298 K. The rectifying performance of the copper oxide contacts was significantly better than the plain copper contacts with rectifying ratios at ±1 V of 3×10$^7$ and 3×10$^2$ respectively. FIG. 19 shows a $\Phi_B$ versus η plot for multiple copper oxide Schottky-like contacts, giving a $\Phi_B^{hom*}$ value of 0.94 eV. The image force controlled ideality factor, $\eta_{if}$, for the hydrothermal zinc oxide wafer is also shown in FIG. 19. The ideality factors of the copper oxide contacts, while good by literature standards, were significantly higher than those for the silver, iridium, and platinum oxide contacts.

4. Conclusions

Figure 20:
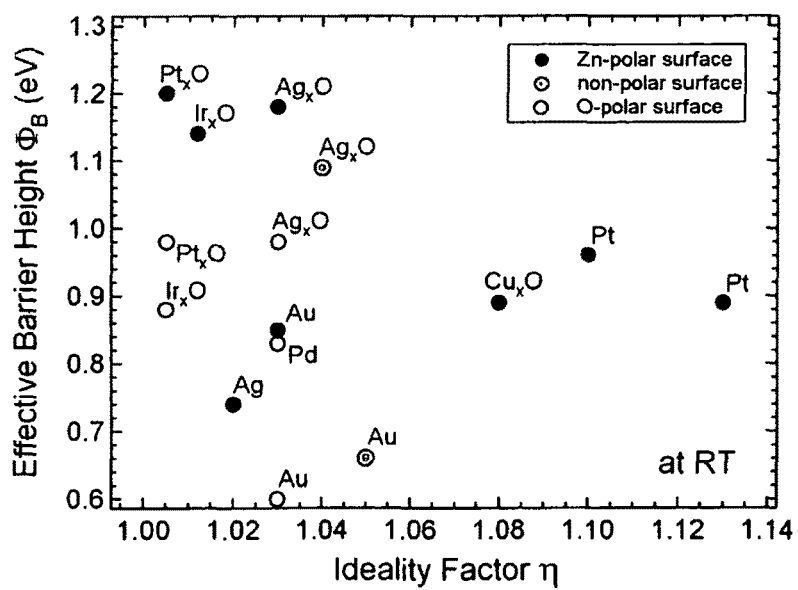
FIG. 20 shows the room temperature barrier height ($\Phi_B$) versus ideality factor ($\eta$) for metal oxide Schottky-like contacts and known metal Schottky contacts.

Silver, copper, iridium and platinum oxide films fabricated in reactive oxygen ambients, using either reactive RF sputtering or pulsed laser ablation of metal targets, consistently produced high performance Schottky-like contacts to bulk ZnO. FIG. 20 shows the ideality factors (η) and effective barrier heights ($\Phi_B$) of the best Schottky-like contacts fabricated using these metal oxide films compared to the best reported results using plain metal contacts.

It is clear that the silver, iridium and platinum oxide Schottky-like contacts, in particular, significantly outperform their plain metal counterparts. The barrier heights of the silver, iridium and platinum oxide contacts were significantly higher than those for plain metals and their ideality factors were very close to the image force controlled limit, indicating that these Schottky-like metal oxide contacts have excellent homogeneity and that the current transport through these Schottky-like metal oxide contacts is almost purely thermionic. In addition, the superior rectifying properties of these metal oxide contacts can be consistently reproduced and with high yields, which has proved difficult to achieve with plain metals and is important for device fabrication.

The metal oxide contacts (with the exception of copper oxide) were metal rich with significantly lower oxygen fractions than those expected for stoichiometric oxide films. The metal oxide contacts all had a continuous valence band density of states near the Fermi level indicating a metallic-like nature. Most of the metal oxide films, with the exception of iridium oxide, had low lateral conductivity requiring the use of a metal capping layer to achieve good current flow through the Schottky-like contacts.

INDUSTRIAL APPLICATION

The present invention provides Schottky-like and ohmic contacts, and a method of forming such contacts. The contacts of the invention may have application in diodes, power electronics, FET transistors and related structures, and in various optoelectronic devices, such as UV photodetectors.

Advantageously, diodes incorporating the Schottky-like contacts of the invention have very high rectifying ratios, low ideality factors and very low reverse leakage currents. The contacts have good transparency for visible light and UV radiation below the bandgap of the zinc oxide material, and laterally homogeneous depletion layers suitable for detecting UVA and UVB radiation. Therefore, the contacts of the invention may have application in UVA and UVB photodiodes and in erythemally weighted UV photodiodes. Many metal oxides, including iridium oxide and platinum oxide, have excellent thermal stability and may be suitable for high temperature and high power electronics applications. The combination of the high thermal stability of the metal oxide contacts and the excellent radiation hardness of the zinc oxide is highly advantageous for operation in harsh environments, such as space applications.

It is not the intention to limit the scope of the invention to the abovementioned examples only. As would be appreciated by a skilled person in the art, many variations are possible without departing from the scope of the invention as set out in the accompanying claims.

The invention claimed is:

1. A Schottky-like contact comprising a substrate that comprises zinc oxide material and a conducting layer joined to the substrate to define a rectifying barrier at the junction of the substrate and the conducting layer, wherein the conducting layer comprises a conducting metal oxide, and wherein the conducting metal oxide has a metal atomic fraction that is higher than the stoichiometric fraction.

2. The Schottky-like contact as claimed in claim 1, wherein the substrate is bulk grown zinc oxide material or a film of zinc oxide material grown on a secondary substrate.

3. The Schottky-like contact as claimed in claim 1, wherein the zinc oxide material is a ternary oxide selected from the group consisting of: zinc cadmium oxide; zinc beryllium oxide; zinc magnesium oxide; zinc selenium oxide; zinc tellurium oxide; zinc sulfur oxide; and alloys thereof.

4. The Schottky-like contact as claimed in claim 1, wherein the zinc oxide material is n-type doped.

5. The Schottky-like contact as claimed in claim 1, wherein the zinc oxide material is a ternary oxide or an alloy thereof.

6. The Schottky-like contact as claimed in claim 1, wherein the conducting metal oxide is selected from the group consisting of: silver oxide; nickel oxide; ruthenium oxide; iridium oxide; platinum oxide; rhenium oxide; osmium oxide; rhodium oxide; molybdenum oxide; vanadium oxide; copper oxide; palladium oxide; and tungsten oxide.

7. The Schottky-like contact as claimed in claim 1, wherein the conducting metal oxide is selected from the group consisting of: silver oxide; iridium oxide; platinum oxide; and copper oxide.

8. The Schottky-like contact as claimed in claim 1, wherein the silver atomic fraction is at least about 85%, the iridium atomic fraction is at least about 76%, the platinum atomic fraction is at least about 83%, or the copper atomic fraction is at least about 68%.

9. The Schottky-like contact as claimed in claim 1, wherein the ideality factor is less than about 1.50, less than about 1.40, less than about 1.30, less than about 1.20, or less than about 1.10.

10. The Schottky-like contact as claimed in claim 1, wherein the effective barrier height is at least about 0.8 eV.

11. A method of forming a Schottky-like contact comprising the steps:

(a) providing a substrate that comprises zinc oxide material; and
(b) fabricating a layer comprising a conducting metal oxide on the substrate to form a rectifying barrier junction between the metal oxide layer and the zinc oxide material, wherein the conducting metal oxide has a metal atomic fraction that is higher than the stoichiometric fraction.

12. The method as claimed in claim 11, wherein the substrate is bulk grown zinc oxide material or a film of zinc oxide material grown on a secondary substrate.

13. The method as claimed in claim 11, wherein the zinc oxide material is a ternary oxide selected from the group consisting of: zinc cadmium oxide; zinc beryllium oxide; zinc magnesium oxide; zinc selenium oxide; zinc tellurium oxide; zinc sulfur oxide; and alloys thereof.

14. The method as claimed in claim 11, wherein the zinc oxide material is n-type doped.

15. The method as claimed in claim 11, wherein the zinc oxide material is a ternary oxide or an alloy thereof.

16. The method as claimed in claim 11, wherein the conducting metal oxide is selected from the group consisting of: silver oxide; nickel oxide; ruthenium oxide; iridium oxide; platinum oxide; rhenium oxide; osmium oxide; rhodium oxide; molybdenum oxide; vanadium oxide; copper oxide; palladium oxide; and tungsten oxide.

17. The method as claimed in claim 11, wherein the conducting metal oxide is selected from the group consisting of: silver oxide; iridium oxide; platinum oxide; and copper oxide.

18. The method as claimed in claim 11, wherein the substrate is ultrasonically cleaned in an organic solvent or mixture of organic solvents prior to fabricating the layer comprising the conducting metal oxide.

19. The method as claimed in claim 11, wherein lift-off photolithographic techniques are used to fabricate a patterned layer of conducting metal oxide on the substrate.

20. The method as claimed in claim 19, wherein the photolithographic developer is tetramethylammonium hydroxide.

21. A Schottky-like contact comprising a substrate that comprises zinc oxide material and a conducting layer joined to the substrate to define a rectifying barrier at the junction of the substrate and the conducting layer, wherein the conducting layer comprises a conducting metal oxide, and wherein the zinc oxide material is a ternary oxide or an alloy thereof.

22. The Schottky-like contact as claimed in claim 21, wherein the substrate is bulk grown zinc oxide material or a film of zinc oxide material grown on a secondary substrate.

23. The Schottky-like contact as claimed in claim 21, wherein the zinc oxide material is a ternary oxide selected from the group consisting of: zinc cadmium oxide; zinc beryllium oxide; zinc magnesium oxide; zinc selenium oxide; zinc tellurium oxide; zinc sulfur oxide; and alloys thereof.

24. The Schottky-like contact as claimed in claim 21, wherein the zinc oxide material is n-type doped.

25. The Schottky-like contact as claimed in claim 21, wherein the conducting metal oxide has a metal atomic fraction that is higher than the stoichiometric fraction.

26. The Schottky-like contact as claimed in claim 21, wherein the conducting metal oxide is selected from the group consisting of: silver oxide; nickel oxide; ruthenium oxide; iridium oxide; platinum oxide; rhenium oxide; osmium oxide; rhodium oxide; molybdenum oxide; vanadium oxide; copper oxide; palladium oxide; and tungsten oxide.

27. The Schottky-like contact as claimed in claim 21, wherein the conducting metal oxide is selected from the group consisting of: silver oxide; iridium oxide; platinum oxide; and copper oxide.

28. The Schottky-like contact as claimed in claim 21, wherein the silver atomic fraction is at least about 85%, the iridium atomic fraction is at least about 76%, the platinum atomic fraction is at least about 83%, or the copper atomic fraction is at least about 68%.

29. The Schottky-like contact as claimed in claim 21, wherein the ideality factor is less than about 1.50, less than about 1.40, less than about 1.30, less than about 1.20, or less than about 1.10.

30. The Schottky-like contact as claimed in claim 21, wherein the effective barrier height is at least about 0.8 eV.

31. A method of forming a Schottky-like contact comprising the steps:
(a) providing a substrate that comprises zinc oxide material, wherein the zinc oxide material is a ternary oxide or an alloy thereof; and
(b) fabricating a layer comprising a conducting metal oxide on the substrate to form a rectifying barrier junction between the metal oxide layer and the zinc oxide material.

32. The method as claimed in claim 31, wherein the substrate is bulk grown zinc oxide material or a film of zinc oxide material grown on a secondary substrate.

33. The method as claimed in claim 31, wherein the zinc oxide material is a ternary oxide selected from the group consisting of: zinc cadmium oxide; zinc beryllium oxide; zinc magnesium oxide; zinc selenium oxide; zinc tellurium oxide; zinc sulfur oxide; and alloys thereof.

34. The method as claimed in claim 31, wherein the zinc oxide material is n-type doped.

35. The method as claimed in claim 31, wherein the conducting metal oxide has a metal atomic fraction that is higher than the stoichiometric fraction.

36. The method as claimed in claim 31, wherein the conducting metal oxide is selected from the group consisting of: silver oxide; nickel oxide; ruthenium oxide; iridium oxide; platinum oxide; rhenium oxide; osmium oxide; rhodium oxide; molybdenum oxide; vanadium oxide; copper oxide; palladium oxide; and tungsten oxide.

37. The method as claimed in claim 31, wherein the conducting metal oxide is selected from the group consisting of: silver oxide; iridium oxide; platinum oxide; and copper oxide.

38. The method as claimed in claim 31, wherein the substrate is ultrasonically cleaned in an organic solvent or mixture of organic solvents prior to fabricating the layer comprising the conducting metal oxide.

39. The method as claimed in claim 31, wherein lift-off photolithographic techniques are used to fabricate a patterned layer of conducting metal oxide on the substrate.

40. The method as claimed in claim 39, wherein the photolithographic developer is tetramethylammonium hydroxide.

* * * * *

UNITED STATES PATENT AND TRADEMARK OFFICE
CERTIFICATE OF CORRECTION

PATENT NO. : 8,508,015 B2  Page 1 of 1
APPLICATION NO. : 12/451530
DATED : August 13, 2013
INVENTOR(S) : Allen et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 546 days.

Signed and Sealed this
Fifteenth Day of September, 2015

Michelle K. Lee
*Director of the United States Patent and Trademark Office*